United States Patent [19]

Kuwano et al.

[11] Patent Number: 5,499,028
[45] Date of Patent: Mar. 12, 1996

[54] ANALOG/DIGITAL CONVERTER

[75] Inventors: Hiromichi Kuwano, Yokohama; Hisashi Tahara, Narashimo, both of Japan

[73] Assignee: Texas Instruments Incorporated, Dallas, Tex.

[21] Appl. No.: 164,185

[22] Filed: Dec. 9, 1993

[30] Foreign Application Priority Data

Dec. 9, 1992 [JP] Japan ..................... 4-351531

[51] Int. Cl.$^6$ ................................. H03M 1/36
[52] U.S. Cl. .......................... 341/159; 341/155
[58] Field of Search ..................... 341/155, 156, 341/159, 158

[56] References Cited

U.S. PATENT DOCUMENTS 4,994,806  2/1991  Yun-Tae .................................. 341/155
5,194,866  3/1993  Imaizumi et al. ....................... 341/156

*Primary Examiner*—Brian K. Young

*Attorney, Agent, or Firm*—William E. Hiller; Richard L. Donaldson

[57] ABSTRACT

An analog/digital converter providing a high conversion speed and resolution while greatly reducing the number of circuit elements. The A/D converter in a first embodiment is a 6-bit resolution flash A/D converter made up of a 3-bit lower A/D conversion section and a 3-bit upper A/D conversion section. The lower A/D conversion section has a stage 1 comparator section 10, containing a specified number of comparators which compare the analog signal to comparison reference voltages of differing values, stepped in equal increments, an adder 12 which combines, in a specified relationship, the outputs from each of the comparators in this stage 1 comparator section 10 and adds them in each group, a second comparator section 14 which combines, in a specified relationship, the specified number of addition results from this adder 12 into pairs and compares these pairs, and a pre-encoder 16, which converts the specified number of comparison results obtained by the second comparator section 14 into 8 binary logical outputs which can be interpreted by lower encoder 18.

4 Claims, 25 Drawing Sheets

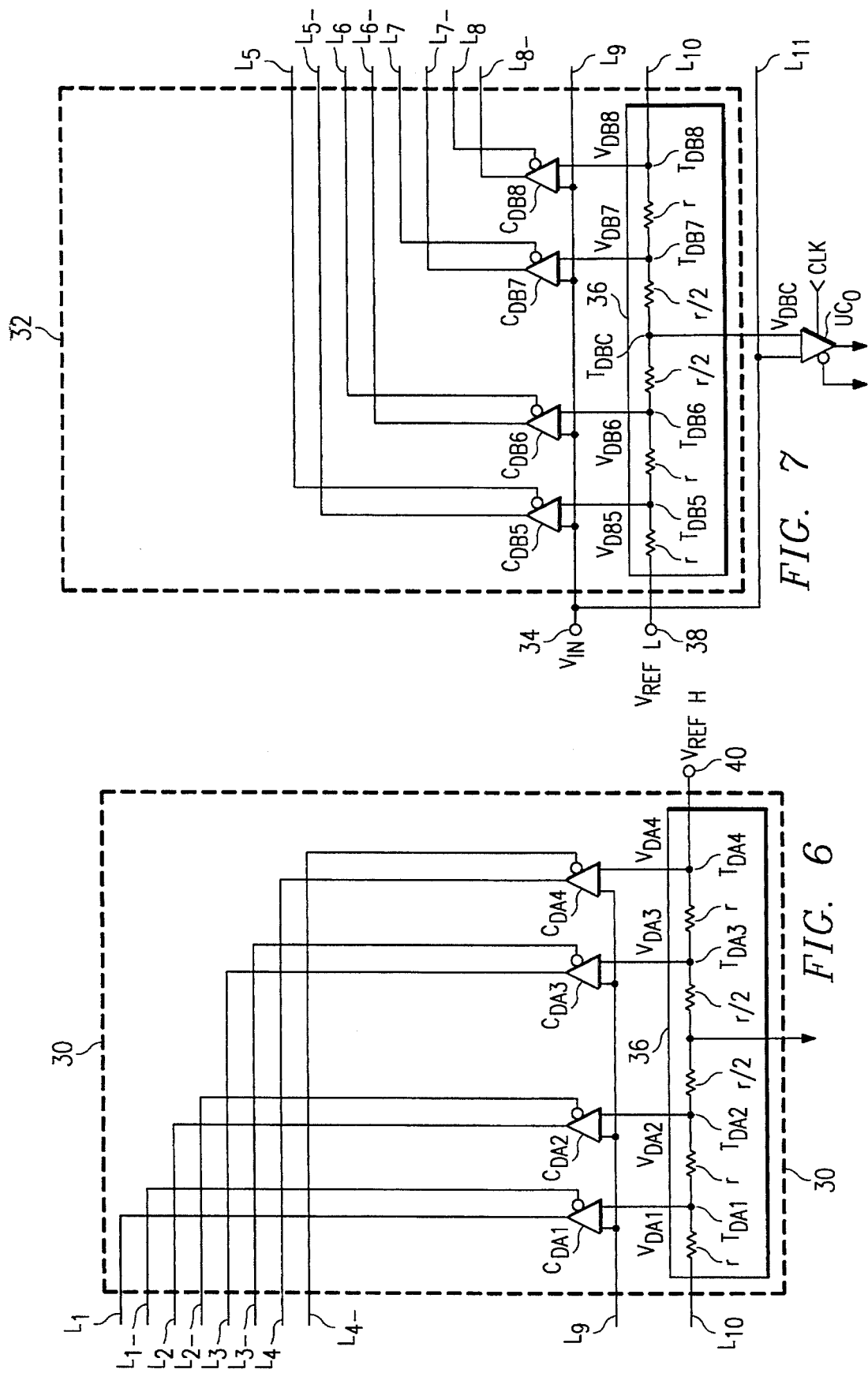

FIG. 9

| | $v_{IN}$ | $C_{iAN}$ $(P_{iAN}, P_{iAN-})$ | $C_{iBN}$ $(P_{iBN}, P_{iBN-})$ | $C_{DAN}$ $(P_{DAN}, P_{DAN-})$ | $(I_{Na}, I_{Nb})$ | $(v_{Na}, v_{Nb})$ | $LC_N$ $(Q_N, Q_{N-})$ |
|---|---|---|---|---|---|---|---|
| ① | $v_{IN} < v_{iAN}$ | (H,L) (o,i) | (H,L) (o,i) | (H,L) (o,i) | (i,2i) | $(V_{CC}-R_i,$ $V_{CC}-2R_i)$ | (H,L) |
| ② | $v_{iAN} < v_{IN} < v_{iBN}$ | (L,H) (i,o) | (H,L) (o,i) | (H,L) (o,i) | (2i,i) | $(V_{CC}-2R_i,$ $V_{CC}-R_i)$ | (L,H) |
| ③ | $v_{iBN} < v_{IN} < v_{DAN}$ | (L,H) (i,o) | (L,H) (i,o) | (H,L) (o,i) | (i,2i) | $(V_{CC}-R_i,$ $V_{CC}-2R_i)$ | (H,L) |
| ④ | $v_{DAN} < v_{IN}$ | (L,H) (i,o) | (L,H) (i,o) | (L,H) (i,o) | (2i,i) | $(V_{CC}-2R_i,$ $V_{CC}-R_i)$ | (L,H) |

FIG. 11

| | $v_{IN}$ | $C_{DBN}$ $(P_{DBN}, P_{DBN-})$ | $C_{iAN}$ $(P_{iAN}, P_{iAN-})$ | $C_{iBN}$ $(P_{iBN}, P_{iBN-})$ | $(I_{Na}, I_{Nb})$ | $(v_{Na}, v_{Nb})$ | $LC_N$ $(Q_N, Q_{N-})$ |
|---|---|---|---|---|---|---|---|
| ① | $v_{IN} < v_{DBN}$ | (H,L) (o,i) | (H,L) (o,i) | (H,L) (o,i) | (2i,i) | $(V_{CC}-2R_i,$ $V_{CC}-R_i)$ | (L,H) |
| ② | $v_{DBN} < v_{IN} < v_{iAN}$ | (L,H) (i,o) | (H,L) (o,i) | (H,L) (o,i) | (i,2i) | $(V_{CC}-R_i,$ $V_{CC}-2R_i)$ | (H,L) |
| ③ | $v_{iAN} < v_{IN} < v_{iBN}$ | (L,H) (i,o) | (L,H) (i,o) | (H,L) (o,i) | (2i,i) | $(V_{CC}-2R_i,$ $V_{CC}-R_i)$ | (L,H) |
| ④ | $v_{iBN} < v_{IN}$ | (L,H) (i,o) | (L,H) (i,o) | (L,H) (i,o) | (i,2i) | $(V_{CC}-R_i,$ $V_{CC}-2R_i)$ | (H,L) |

| $V_{IN}$ | $Q_1 \sim Q_8$ | $Q_1_- \sim Q_{8-}$ | $NA_1 \sim NA_8$ | $NB_1 \sim NB_8$ |
|---|---|---|---|---|
| $V_{IN} < V_{iA1}$ | 11111111 | 00000000 | 00000000 | 00000000 |
| $V_{iA1} < V_{IN} < V_{iA2}$ | 01111111 | 10000000 | 10000000 | 00000000 |
| $V_{iA2} < V_{IN} < V_{iA3}$ | 00111111 | 11000000 | 01000000 | 00000000 |
| $V_{iA3} < V_{IN} < V_{iA4}$ | 00011111 | 11100000 | 00100000 | 00000000 |
| $V_{iA4} < V_{IN} < V_{iA5}$ | 00001111 | 11110000 | 00010000 | 00000000 |
| $V_{iA5} < V_{IN} < V_{iA6}$ | 00000111 | 11111000 | 00001000 | 00000000 |
| $V_{iA6} < V_{IN} < V_{iA7}$ | 00000011 | 11111100 | 00000100 | 00000000 |
| $V_{iA7} < V_{IN} < V_{iA8}$ | 00000001 | 11111110 | 00000010 | 00000000 |
| $V_{iA8} < V_{IN} < V_{iB1}$ | 00000000 | 11111111 | 00000001 | 00000000 |
| $V_{iB1} < V_{IN} < V_{iB2}$ | 10000000 | 01111111 | 00000000 | 10000000 |
| $V_{iB2} < V_{IN} < V_{iB3}$ | 11000000 | 00111111 | 00000000 | 01000000 |
| $V_{iB3} < V_{IN} < V_{iB4}$ | 11100000 | 00011111 | 00000000 | 00100000 |
| $V_{iB4} < V_{IN} < V_{iB5}$ | 11110000 | 00001111 | 00000000 | 00010000 |
| $V_{iB5} < V_{IN} < V_{iB6}$ | 11111000 | 00000111 | 00000000 | 00001000 |
| $V_{iB6} < V_{IN} < V_{iB7}$ | 11111100 | 00000011 | 00000000 | 00000100 |
| $V_{iB7} < V_{IN} < V_{iB8}$ | 11111110 | 00000001 | 00000000 | 00000010 |
| $V_{iB8} < V_{IN}$ | 11111111 | 00000000 | 00000000 | 00000001 |

1=H LEVEL     0= L LEVEL

*FIG. 12*

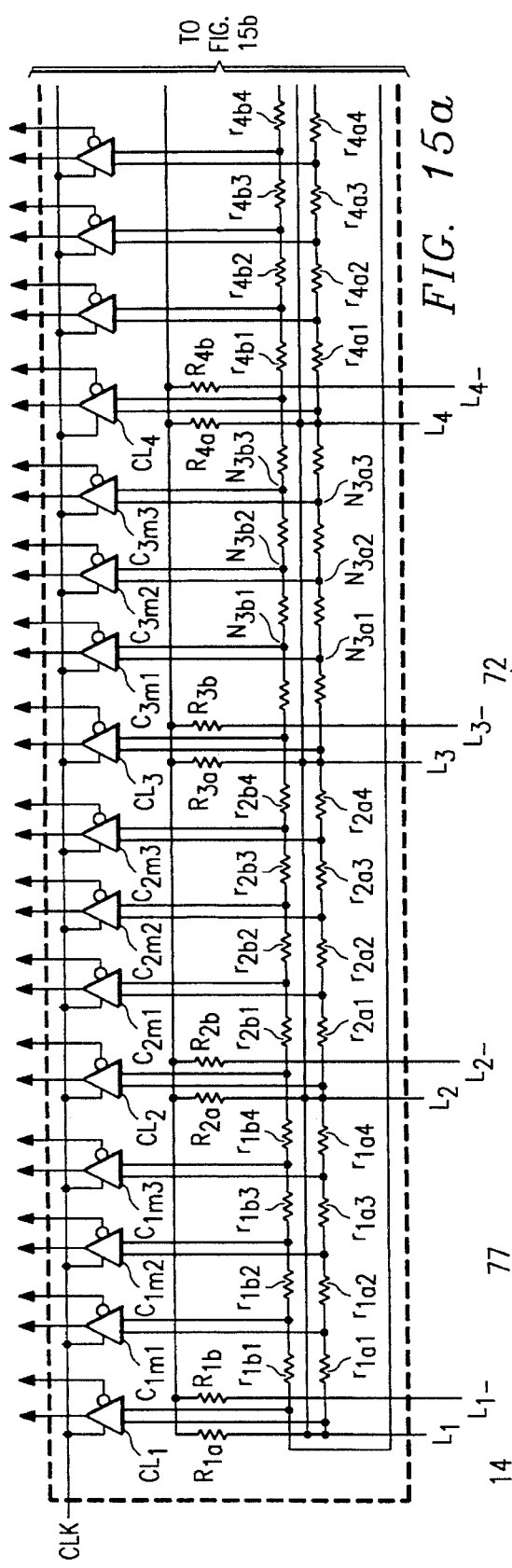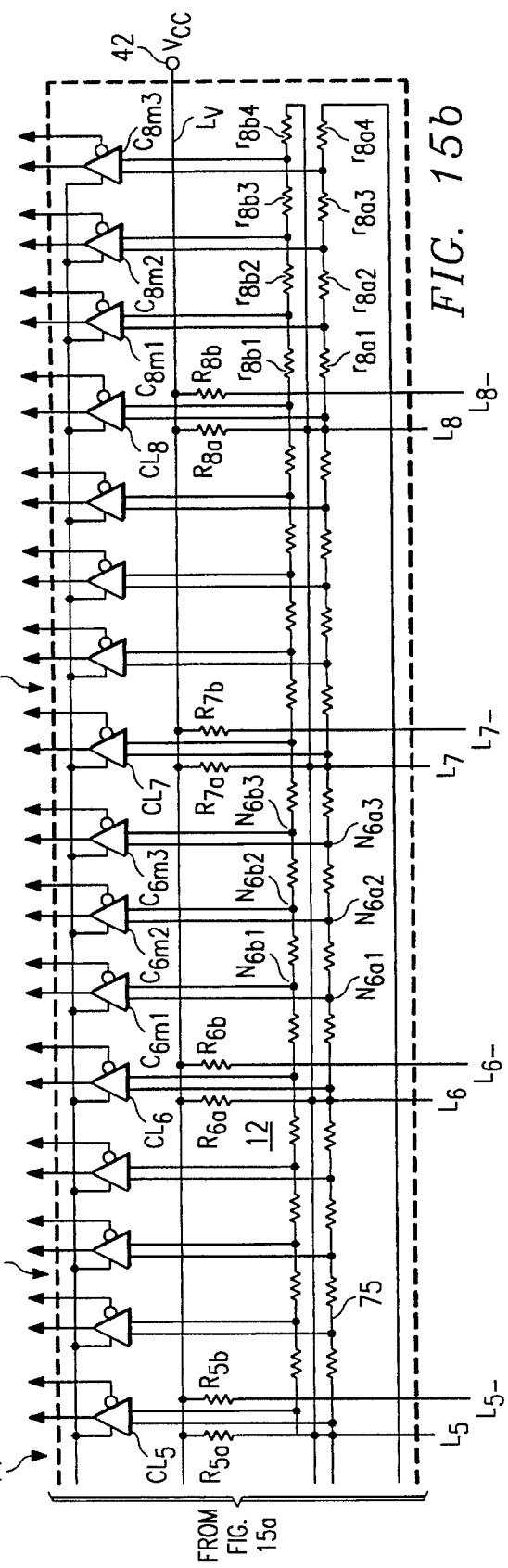

| LATCHED COMPARATOR | INPUT | OUTPUT (NONINVERTING, INVERTING) |
|---|---|---|
| $CL_{N-1}$ | $V_{(N-1)a} < V_{(N-1)b}$ | (L,H) |
| $C_{(N-1)m1}$ | $V_{(N-1)a1} < V_{(N-1)b1}$ | (L,H) |
| $C_{(N-1)m2}$ | $V_{(N-1)a2} < V_{(N-1)b2}$ | (L,H) |
| $C_{(N-1)m3}$ | $V_{(N-1)a3} < V_{(N-1)b3}$ | (L,H) |
| $CL_N$ | $V_{Na} = V_{Nb}$ | (H,L) |
| $C_{Nm1}$ | $V_{Na} > V_{Nb1}$ | (H,L) |
| $C_{Nm2}$ | $V_{Na2} > V_{Nb2}$ | (H,L) |
| $C_{Nm3}$ | $V_{Na3} > V_{Nb3}$ | (H,L) |
| $CL_{N+1}$ | $V_{(N+1)a} > V_{(N+1)b}$ | (H,L) |

FIG. 19

| LATCHED COMPARATOR | INPUT | OUTPUT (NONINVERTING, INVERTING) |
|---|---|---|
| $CL_{N-1}$ | $V_{(N-1)a} < V_{(N-1)b}$ | (L,H) |
| $C_{(N-1)m1}$ | $V_{(N-1)a1} < V_{(N-1)b1}$ | (L,H) |
| $C_{(N-1)m2}$ | $V_{(N-1)a2} < V_{(N-1)b2}$ | (L,H) |
| $C_{(N-1)m3}$ | $V_{(N-1)a3} < V_{(N-1)b3}$ | (L,H) |
| $CL_N$ | $V_{Na} < V_{Nb}$ | (L,H) |
| $C_{Nm1}$ | $V_{Na1} = V_{Nb1}$ | (H,L) |
| $C_{Nm2}$ | $V_{Na2} > V_{Nb2}$ | (H,L) |
| $C_{Nm3}$ | $V_{Na3} > V_{Nb3}$ | (H,L) |
| $CL_{N+1}$ | $V_{(N+1)a} > V_{(N+1)b}$ | (H,L) |

FIG. 21

ANALOG/DIGITAL CONVERTER

This invention pertains to a flash A/D converter.

BACKGROUND OF THE INVENTION

An A/D converter is a kind of interface circuit, which converts analog signals to digital signals; it has come to enjoy wide use with the spread of digital technology and microprocessor technology. In broad terms, A/D converters can be divided into 3 conversion methods: the flash (serial) type, the successive integration type, and the integrating type; however, in applications where a high conversion speed is required, the flash type is in widest use.

FIG. 22 shows a circuit configuration of a representative conventional flash A/D converter. In a flash A/D converter with a resolution of N bits, $(2^N-1)$ comparators are connected in series to the input analog signal. Therefore, for 8 bits, as shown in FIG. 22, 255 comparators CO1, CO2, ... CO255 are provided, and one of the input terminals to each of these is the analog signal input terminal 100, connected in series (in common). To the other input terminal on these comparators CO1, CO2, CO255 is applied one of 255 comparison reference voltages V1, V2, ... V255, which are obtained by voltage dividing a reference voltage (Vref, T −Vref, B ) corresponding to full scale, using 255 equal-value resistors r1, r2, ... r 255.

In each comparator COi a comparison is made between the input analog signal VIN voltage level and the comparison reference voltage Vi. An H level output voltage is obtained on the noninverting output of each comparator COi when the relationship VIN>Vi is established. When the relationship VIN<Vi is established, an L level voltage is obtained on the noninverting output of each comparator COi. These comparators CO1, CO2, ... CO255 are latched comparators; they hold their output voltage levels when the clock is input from clock driver 102.

An equal number (255) of AND circuits AG1, AG2, ... AG255 is provided on the output side of these comparators CO1, CO2, ... CO255, and the noninverting output of each comparator COi is connected to one of the input terminals of the corresponding AND gate AGi, while the inverting input terminal is connected to the other input terminal of the AND gate AGi+1 corresponding to the adjacent comparator. In this manner, an H level output voltage will be obtained only at the output of the AND circuit AGi connected to the noninverting output of the comparator COi on which an H output voltage level exists at the lowest comparison reference voltage; an L level output voltage is obtained at the output of other AND circuits. Encoder 104 converts the 255 binary logical outputs input from the outputs of AND circuits AG1, AG2, ... AG255 to an 8-bit signal. 8-bit digital signal output from encoder 104 is temporarily stored in output buffer 106, and this is then sent out in sync with the clock.

FIG. 23 shows a circuit diagram for a 2 step flash A/D converter, well known as an improvement on the flash A/D converter. In a 2 step flash type, the A/D converter conversion operation is divided into an upper and lower step.

In FIG. 23, the analog VIN signal input to analog signal input terminal 110 is applied to one of the input terminals of differential amplifier 114 through sample-and-hold circuit 112 as well as to upper A/D converter 116. Upper A/D converter 116 A/D converts the input analog signal VIN to, for example, upper 4-bit digital data item. These upper 4-bit data items are reconverted to an analog signal by D/A converter 118, whereupon it is input to the other input terminal on differential amplifier 114. Differential amplifier 114 subtracts the upper 4-bit analog portion from input analog signal VIN and applies the difference to lower A/D converter 120. Lower A/D converter 120 does an A/D conversion of the input differential signal to, for example, a 4-bit data item. The 4-bit item data output from lower A/D converter 120 is combined as the lower 4 bits with the upper 4 bits from upper A/D converter 116. In the end an 8-bit digital signal is obtained.

With the 2 step flash type, because, as we have described, the A/D conversion operation is conducted twice (2 step operation), one for the upper and one for the lower bits, a sample-and-hold circuit 112 is provided so that the input analog signal does not change during the A/D conversion. Problems the invention aims to solve In the flash A/D converter representative of conventional technology described above, the comparison operation takes place in all comparators simultaneously, so a very high conversion speed can be obtained; however, the number of circuit elements expands exponentially as resolution increases, with the disadvantage of increasing the scale of the circuit. As described above, if resolution is N bits, $(2^N-1)$ comparators are required; however, that which has an even larger effect on circuit real estate is encoders. FIG. 24 shows a circuit diagram for a common encoder. This encoder circuit is used for a 4-bit flash A/D converter, so it has 15 binary logic voltage inputs Y1–Y15, and internal transistor logic circuits encode those binary logic voltages to a 4-bit (D0,D1,D2,D3) digital signal. So for a 4-bit encoder we have 15 inputs; for an 8-bit this becomes 255, and for a 10-bit it becomes 1023, with the number of elements in the internal transistor logic circuitry expanding exponentially with the increase in input terminals, and circuit area grows enormously.

On that point, the 2 step flash type makes it possible to greatly decrease the number of elements and reduce circuit area. For example, in the 2 step flash A/D converter shown in FIG. 23, the resolution of upper A/D converter 116 and lower A/D converter 120 is 4 bits in both cases, so the number of comparators required is $(2^4-1)=15$; even adding the two together gives only 30 comparators. This is a large reduction compared to the representative A/D converter shown in FIG. 22 (255 comparators). Also, since the number of comparators is small, a small number of encoder input terminals will also suffice. However, because 2 step flash A/D converters divide the A/D conversion operation into an upper and lower step, it is necessary to hold the input with a sample-and-hold [circuit]. There is also a basic disadvantage in the limitation of conversion speed. Furthermore, because the analog signal is roughly A/D converted by the upper A/D converter, the upper bit accuracy is low, and this error can cause large errors in the digital signal value, requiring error correction circuitry.

SUMMARY OF THE INVENTION

This invention provides an A/D converter which will retain a high conversion speed and high resolution, while greatly reducing the number of circuit elements. To the latter end, a first A/D converter in accordance with this invention is constituted by a reference voltage generation means which applies different comparison voltages to each fixed value from multiple taps in a stepped manner; a first comparator section made up of multiple comparators having noninverting outputs and inverting outputs which generate a complementary binary output with one set of input terminals connected in a one-to-one relationship with the taps on the reference voltage generation means above and with another set of input terminals connected to a common [set of] analog signal inputs, these comparators are divided into one or multiple blocks, and each block is divided into a first set and a second set; a second comparator section made up of multiple comparators in which each of the first input terminals belonging to the first set of each block of the aforementioned first comparator is connected in a one-to-one relationship to the noninverting outputs of the comparator, and at the same time is connected in a one-to-one relationship to the inverting output terminals of the comparators belonging to the second set, and each of the other set of input terminals is connected in a one-to-one relationship with the inverting outputs of the comparators belonging to the first set of each block of the aforementioned stage 1 comparator section, and at the same time is connected in a one-to-one relationship to the inverting output terminals of the comparators belonging to the first set; an adding section having a first adding means which is placed between the aforementioned first comparator section and the aforementioned second comparator section and adds the comparator outputs of the aforementioned first comparator connected in series with the first input terminals of the comparator of the aforementioned second comparator and a second adding means which logically adds the outputs of the comparator of the aforementioned first comparator section connected in common with the other input terminals of each comparator of the aforementioned second comparator section; and a coding means which is connected to the outputs of the comparators in the aforementioned second comparator section and combines and codes the binary logical outputs obtained at each of the outputs of those comparators to a digital signal of a selected number of bits.

A second A/D converter in accordance with the invention comprises reference voltage generation means which applies different comparison voltages of fixed value from multiple taps in a stepped manner; a first comparator section made up of multiple differential amplifiers having one set of input terminals which is connected in a one-to-one relationship with the taps on the aforementioned reference voltage generation means and with another set of input terminals connected to a common [set of] analog signal inputs, and noninverting outputs and inverting outputs which generate a complementary output voltage in response to the difference between the input voltage applied to the aforementioned first set of input terminals and the other input voltage applied to the aforementioned other set of input terminals; these differential amplifiers are divided into one or multiple blocks, and each block is divided into a first set and a second set; a second comparator section made up of multiple first comparators in which each of the first input terminals belonging to the first set of each block of the aforementioned first comparator is connected in a one-to-one relationship to the noninverting outputs of the differential amplifier, and at the same time is connected in a one-to-one relationship to the inverting output terminals of the differential amplifier belonging to the second set, and each of the other set of input terminals is connected in a one-to-one relationship with the inverting outputs of the differential amplifier belonging to the first set of each block of the aforementioned stage 1 comparator section, and at the same time is connected in a one-to-one relationship to the inverting output terminals of the comparators belonging to the first set; an adding section having a first adding means which is placed between the aforementioned first comparator section and the aforementioned second comparator section and adds the differential amplifier outputs of the aforementioned first comparator section connected in series with the input terminals of the comparator of the aforementioned second comparator and a second adding means which logically adds the outputs of the differential amplifier of the aforementioned first comparator section connected in series with the other input terminals of each comparator of the aforementioned second comparator section; a resistor network composed of a first resistor network comprising a specified number of 2 or more resistors connected in series between one set of input terminals of the 2 aforementioned first comparators of the aforementioned second comparator section, connected respectively to the noninverting outputs of the 2 selectable aforementioned differential amplifiers into which, in each block of the aforementioned first comparator section in the aforementioned reference voltage generation means, 2 comparison reference voltages, differing by only one increment, are selectively input; a second resistor network comprising the aforementioned specified number of resistors and connected in series between one set of input terminals of the 2 aforementioned second comparators to which are connected, respectively, to the inverting input terminals of the aforementioned 2 selectable differential amplifiers; a third resistor network comprising the aforementioned specified number of resistors and connected in series between the one set of input terminals of the first comparator of the aforementioned second comparator section, which are connected to the noninverting input terminals of the aforementioned differential amplifier, into which the highest reference voltage is input from the aforementioned reference voltage generation means in each block of the aforementioned first comparator section, and the other set of input terminals of the first comparator of the aforementioned second comparator section, which are connected to the inverting input terminals of the aforementioned differential amplifier, into which the lowest reference voltage is input from the aforementioned reference voltage generation means in each block of the aforementioned first comparator section; and a fourth resistor network comprising the aforementioned specified number of resistors and connected in series between the other set of input terminals of the first comparator of the aforementioned second comparator section, which are connected to the inverting input terminals of the aforementioned differential amplifier, into which the highest reference voltage is input from the aforementioned reference voltage generation means in each block of the aforementioned first comparator section, and the one set of input terminals of the first comparator of the aforementioned stage 2 comparator section, which are connected to the noninverting input terminals of the aforementioned differential amplifier, into which the lowest reference voltage is input from the aforementioned reference voltage generation means in each block of the aforementioned first comparator section, a third comparator section made up of multiple second comparators in which each of one set of input terminals is connected in a one-to-one relationship with the aforementioned first resistor network node and the aforementioned third resistor network node of the aforementioned resistor network, and each of the one set is connected in a one-to-one relationship with the aforementioned second resistor network node and the aforementioned fourth resistor network node of the aforementioned resistor network; and an encoding means which is connected to the outputs of the comparators in the aforementioned second and third comparator sections and combines and encodes the binary logical outputs obtained at each of the outputs of those comparators to a digital signal of a selected number of bits.

Also, a third A/D converter in accordance with the invention includes, in addition to the first, second, and third comparator sections, a fourth comparator section made up of multiple comparators in which each of one set of input terminals is connected to the taps of the aforementioned reference voltage generation means, which applies a reference voltage set within a reference voltage range with respect to the first and second sets in each block of the aforementioned first comparator section, and each of the other set of input terminals is connected to the aforementioned analog signal input terminals; and an upper bit encoding means which is connected to the outputs of the comparators in the aforementioned fourth comparator section and creates a digital signal of a selected number of bits based on the binary logical outputs obtained at each of the outputs of those comparators.

In the first A/D converter, when the input analog signal voltage level is within the comparison reference voltage range of a selected block or, more specifically, when it is within the comparison reference voltage range of the first group or second group in that block, binary logical outputs corresponding to the comparison output values of the first group or second group in that block will be obtained on the stage 2 comparator section comparator outputs. In this way, even if the input analog signal voltage level is within the comparison reference voltage ranges of the first group or second group, a specified number of binary logical outputs will be obtained at the stage 2 comparator section outputs corresponding to the first group or second group comparator comparison output values. These specified number of binary logical outputs are then converted by an encoding means into a digital signal of specified bit length.

In the second A/D converter, the output of the adjacent adding means is obtained at each resistor network node of the resistor network, increasing the number of comparison sampling points by that extent, and increasing resolution.

In the third A/D converter, the upper A/D converter operates in parallel with and in sync with the lower A/D converter, so the upper and lower bits are obtained at the same time. Also, the upper bits are determined based on the output of the lower A/D converter, so the same resolution accuracy is obtained in the upper A/D converter as in the lower A/D converter.

BRIEF DESCRIPTION OF THE DRAWINGS

FIGS. 2a and 2b are adjoining segments of a circuit diagram showing the first comparator block 22 in FIG. 1a.

FIGS. 3a and 3b are adjoining segments of a circuit diagram showing the second comparator block 24 in FIG. 1a.

FIG. 6 is a circuit diagram showing the dummy comparator block 30 in FIG. 1b.

FIG. 7 is a circuit diagram showing the dummy comparator block 32 in FIG. 1a.

FIG. 9 is a table showing the operation of the circuit in FIG. 8.

FIG. 11 is a table showing the operation of the circuit in FIG. 10.

FIG. 12 is a table showing the operation of the lower A/D conversion section in the embodiment of FIGS. 1a and 1b.

FIGS. 15a and 15b are adjoining segments of a circuit diagram of block 72 in FIG. 14a, 14b and 14c.

FIG. 19 is a table showing the latched comparator input/output states under the conditions of FIG. 18.

FIG. 21 is a table showing the latched comparator input/output states under the conditions of FIG. 20.

In reference numerals as shown in the drawings:

Figure 1A:
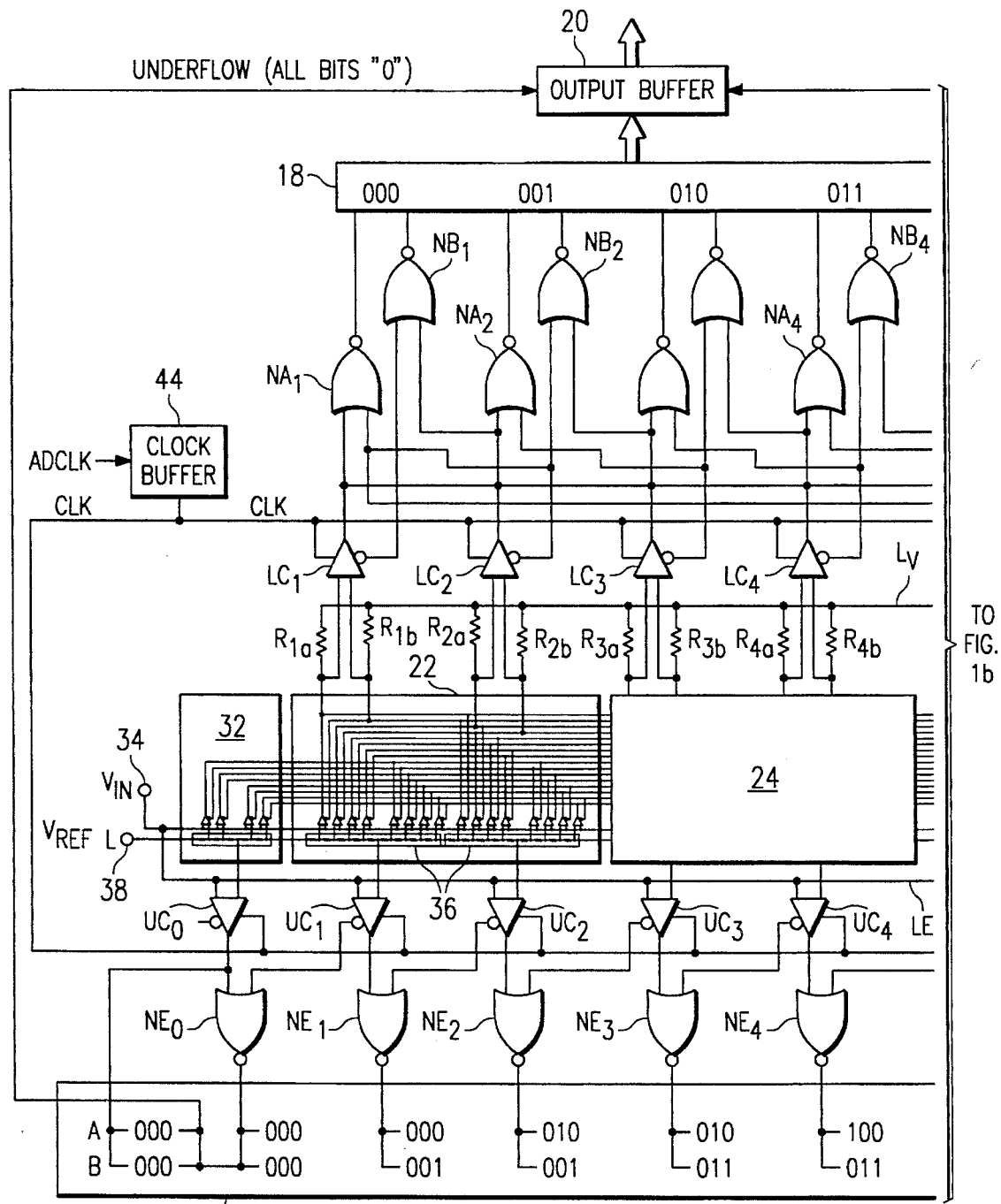
FIGS. 1a and 1b are adjoining segments of a partial schematic circuit diagram showing a first embodiment of a flash A/D converter in accordance with the invention.

10 first comparator section
12 adder
14 second comparator section
16 pre-encoder
18 lower encoder
22–28 comparator block
30, 32 dummy comparator block
34 analog signal input terminal
36 comparison reference voltage generating circuit
50 comparator section
52 pre-encoder
54 upper encoder
70 first comparator section
74 pre-encoder
75 resistor network
76 lower encoder 18
77 stage 3 comparator section
80–86 comparator block
88,90 dummy comparator block

DESCRIPTION OF THE PREFERRED EMBODIMENTS

Figure 1B:
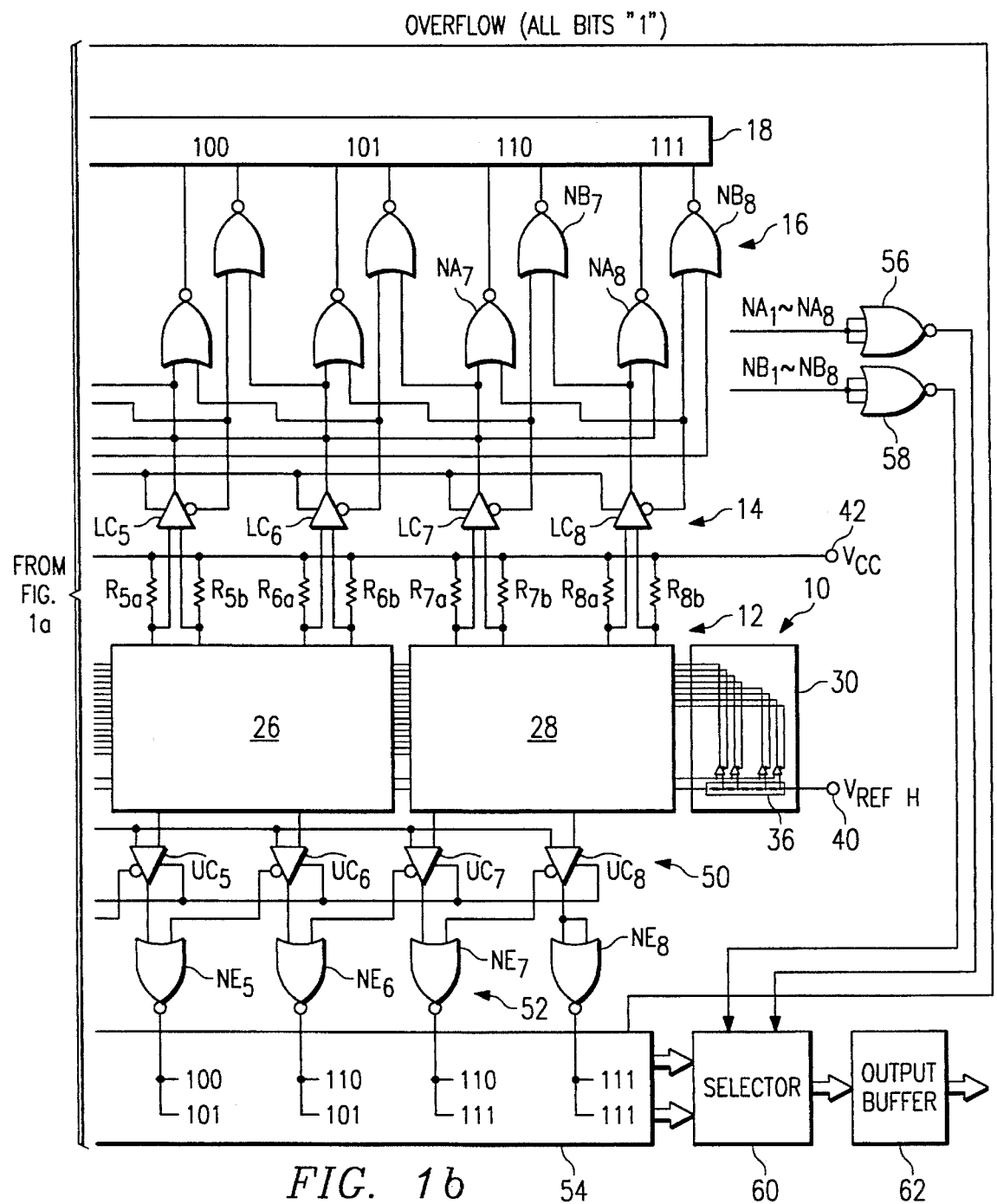

FIGS. 1a and 1b show an overall circuit diagram of a first embodiment of the A/D converter in accordance with the invention. This is a 6-bit flash A/D converter, having a 3-bit upper A/D converter portion and a 3-bit lower A/D converter portion.

The lower A/D converter is made up of a stage 1 comparator section 10 having a selected number of comparators which compares an input analog signal in steps to a comparison reference voltage which changes in fixed increments, an adder 12 which adds the groups of the comparator outputs from this stage 1 comparator section 10, which are each in a selected combination, a second comparator section 14, which makes a comparison of the specified addition results from this adder 12 for each specified combined pair, an upstage encoder 16, which converts the specified comparison results from this second comparator section 14 to 8 binary logical outputs identifiable by lower encoder 18, a lower encoder 18, which encodes the 8 bit binary logic voltages from this upstage encoder 16 into a lower 3-bit digital signal, and an output buffer 20, which synchronizes or synthesizes the lower 3-bit digital signal from lower encoder 18 with the upper bits and outputs them.

The stage 1 comparator section 10 is made up of first-fourth comparator blocks 22–28, composed of comparators which compare the input analog signal with the comparison reference voltages in the full range (the significant A/D conversion voltage range) and a pair of dummy comparison blocks 30, 32, comprising comparators which compare the input analog signal with dummy comparison reference voltages outside the full range; these 6 block comparison blocks are connected in parallel in the order shown in the diagram (32,22–28,20) to the analog signal input terminal 34 and the reference voltage generation circuit 36. Next we shall explain the circuit layouts of these comparison blocks 22–28, 30, 32 with reference to FIGS. 2a, 2b, 3a, 3b, 4a, 4b, 5a, 5b, 6 and 7.

Figure 2A:
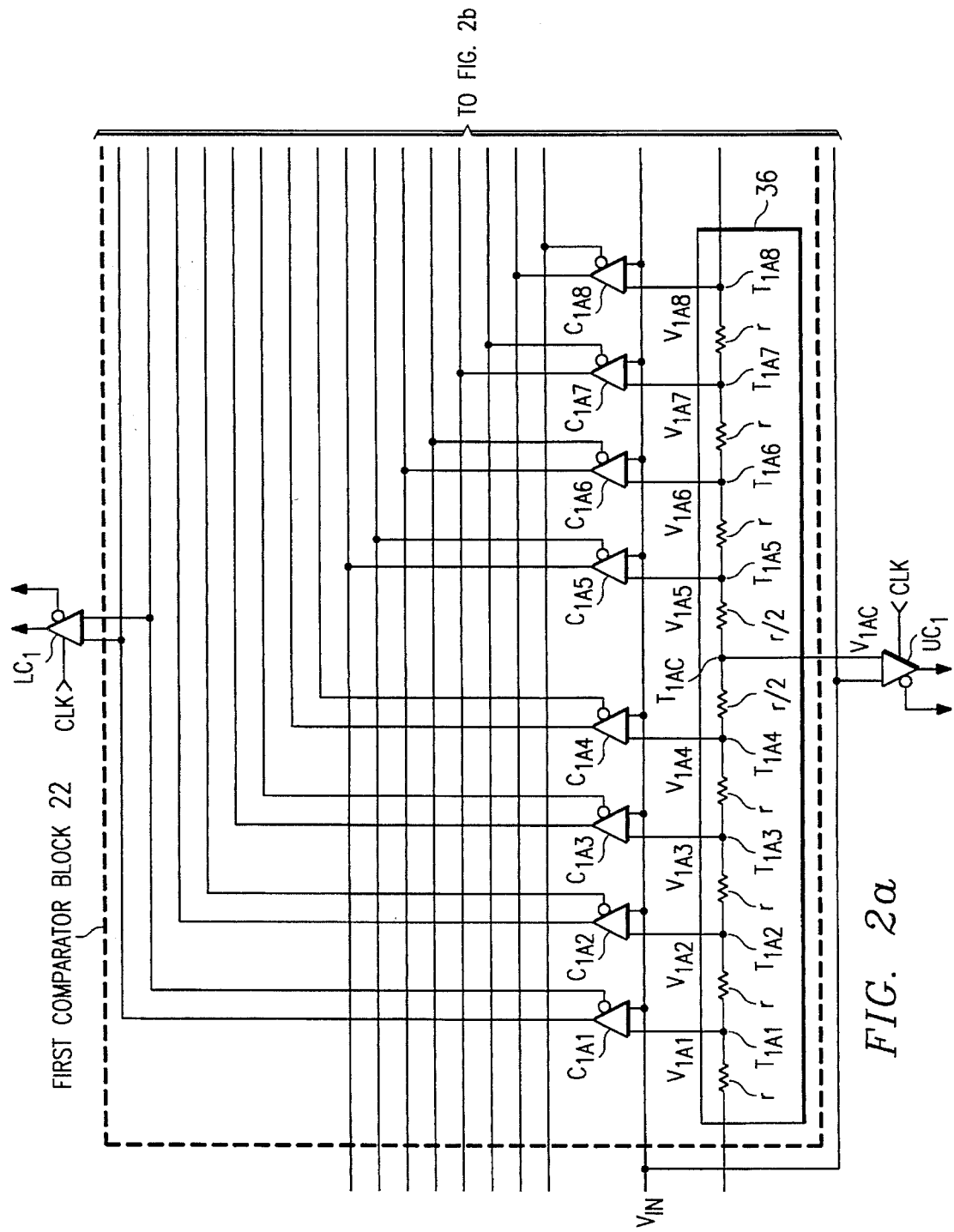
Figure 2B:
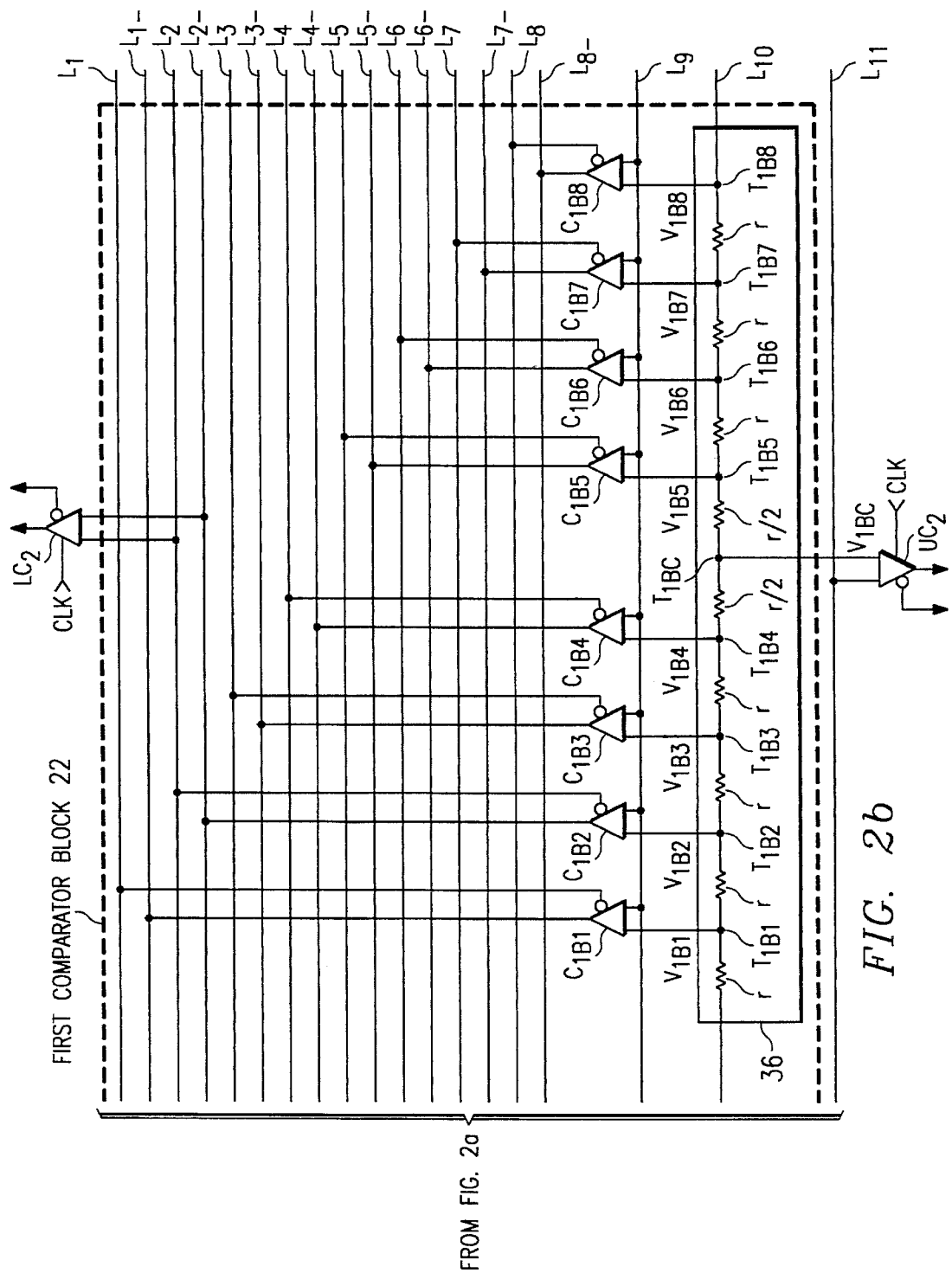
Figure 3A:
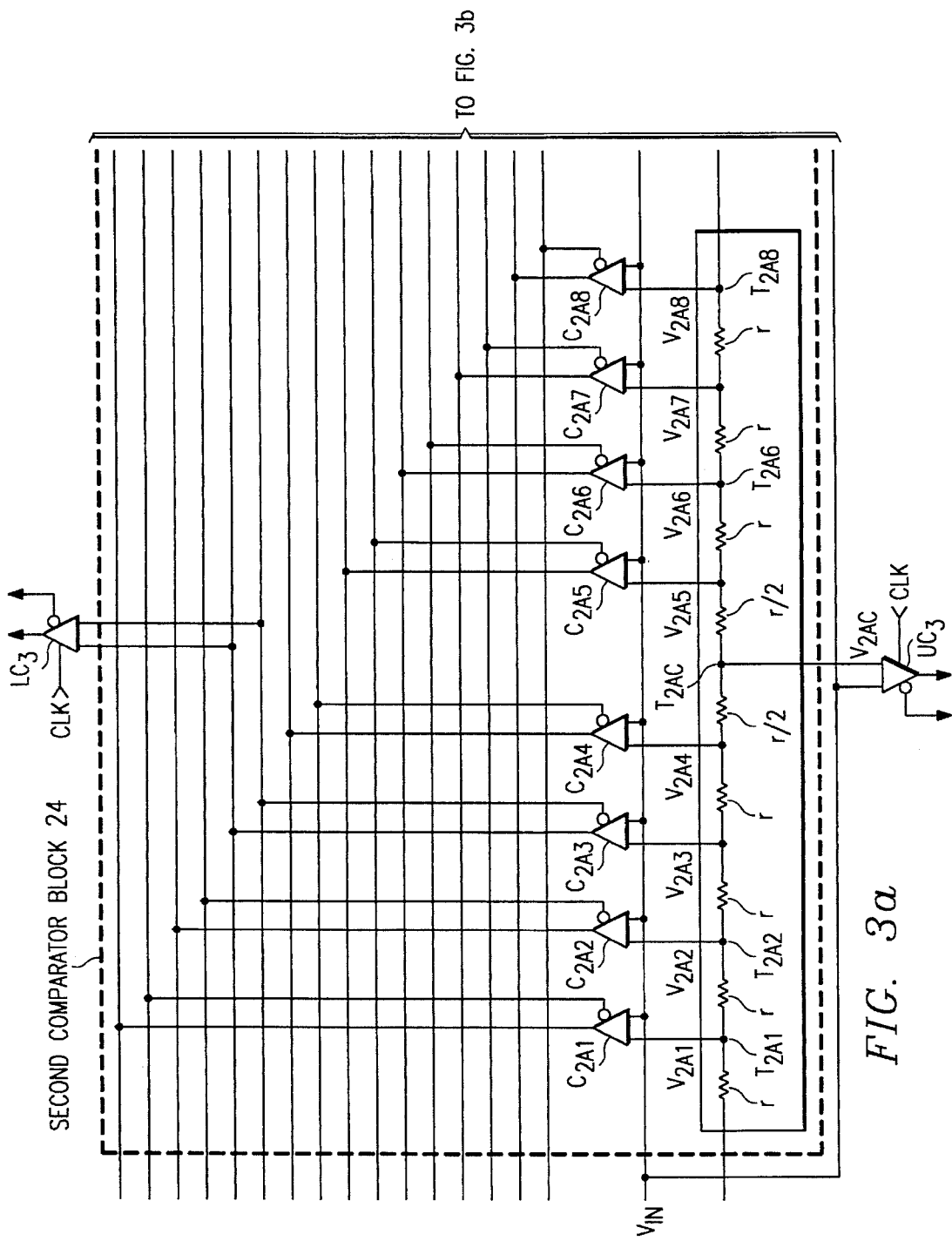
Figure 3B:
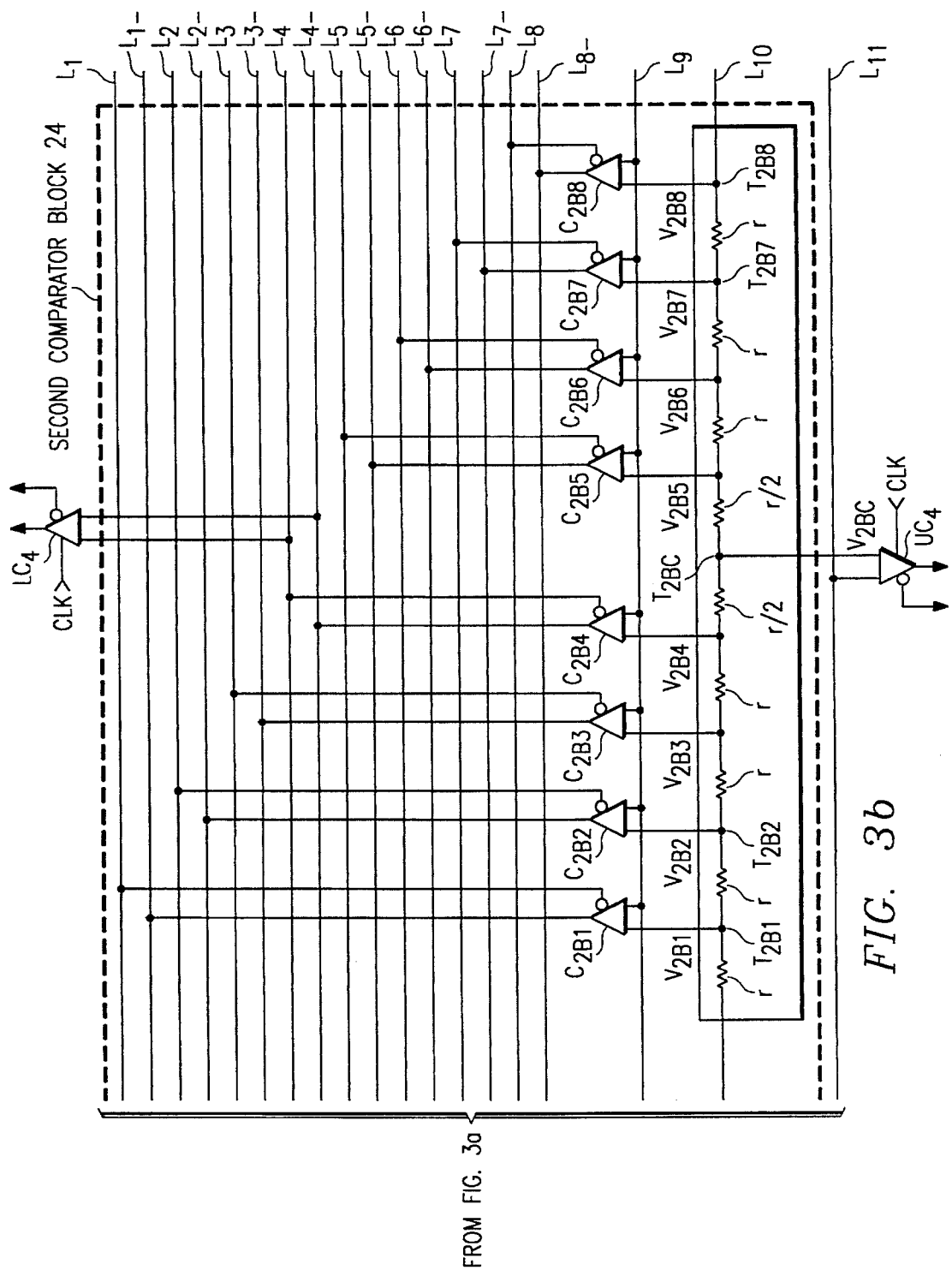
Figure 4A:
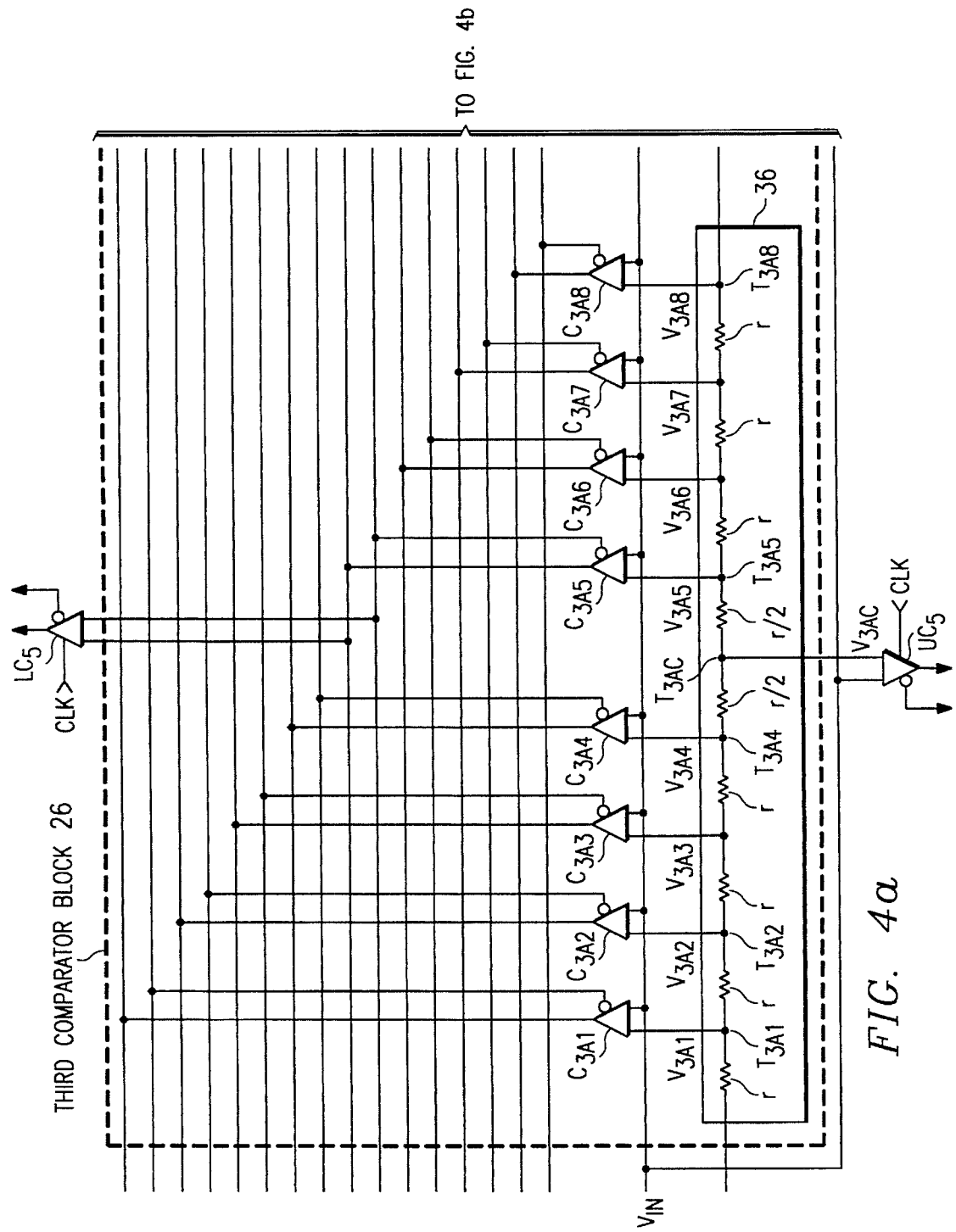
FIGS. 4a and 4b are adjoining segments of a circuit diagram showing the third comparator block 26 in FIG. 1b.
Figure 4B:
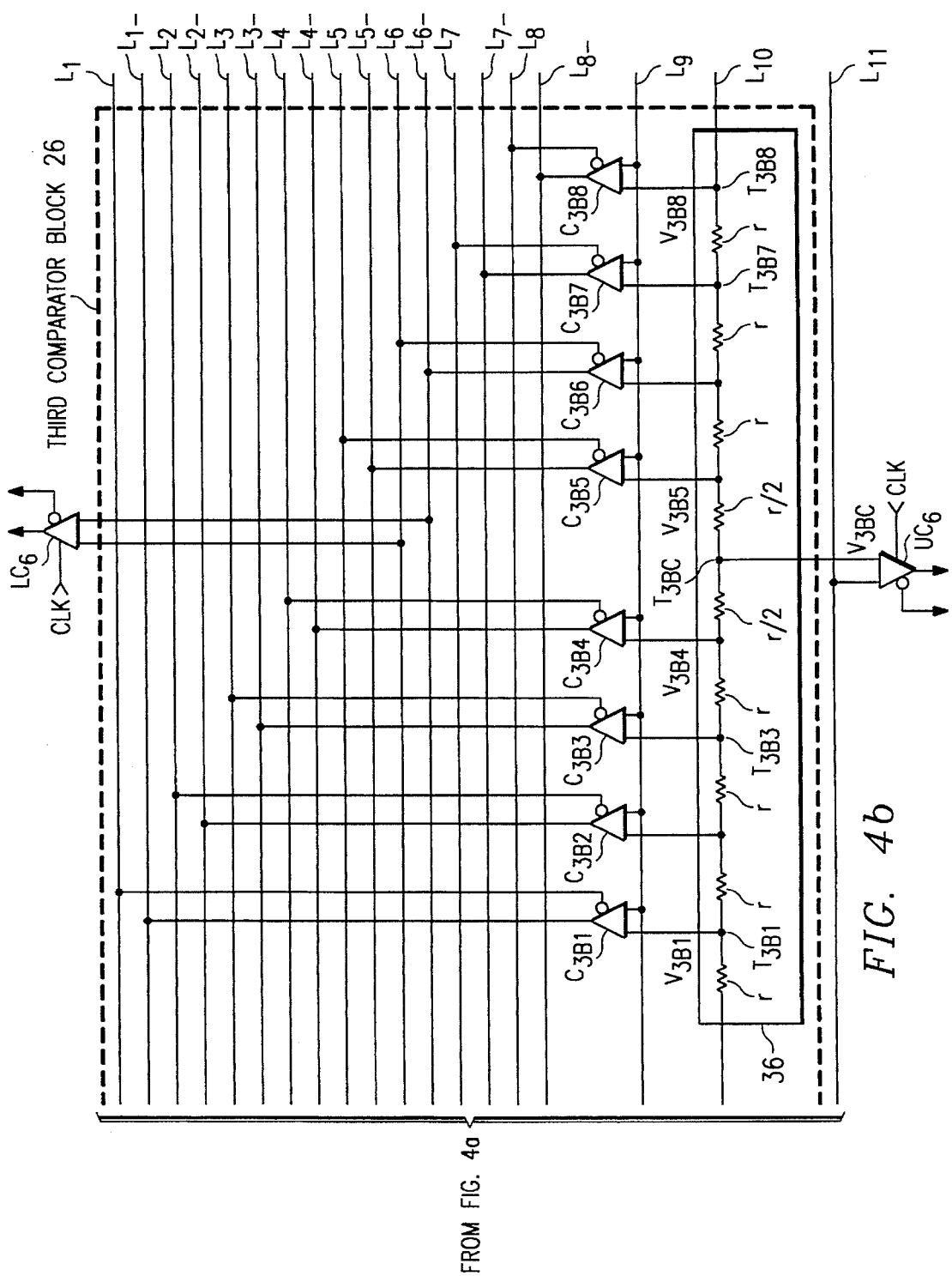
Figure 5A:
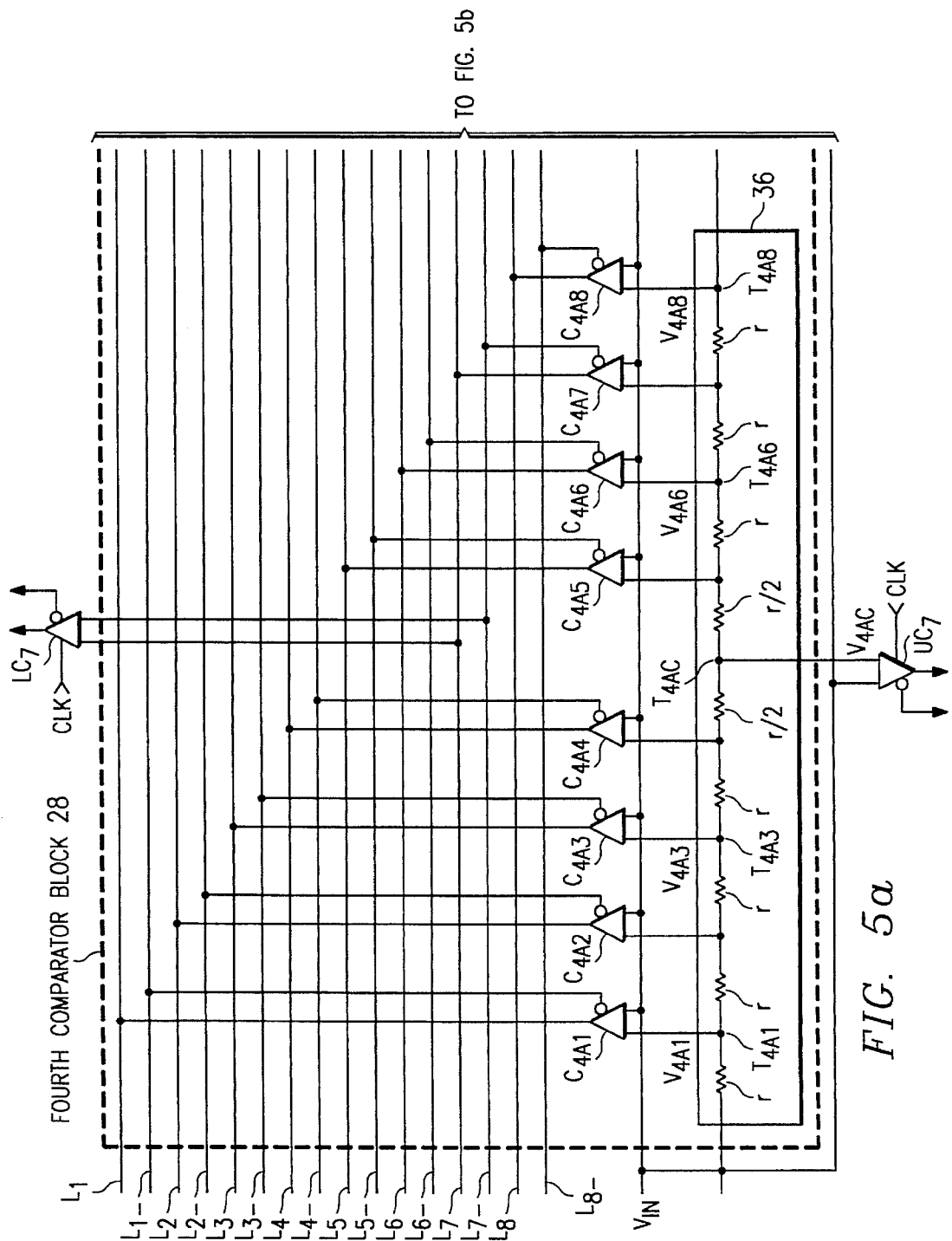
FIGS. 5a and 5b are adjoining segments of a circuit diagram showing the fourth comparator block 28 in FIG. 1b.
Figure 5B:
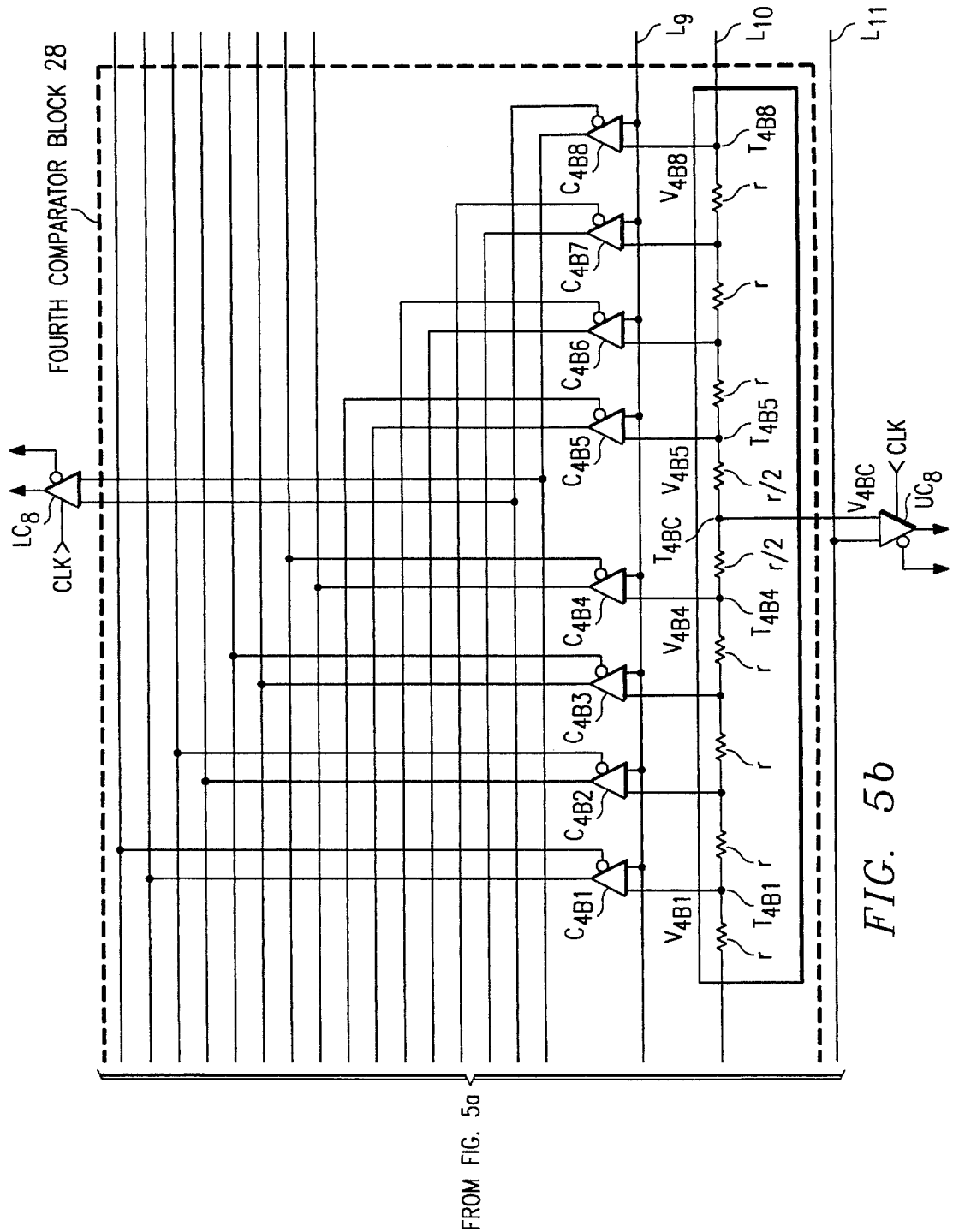

FIGS. 2a and 2b show the circuit layout in the first comparison block 22. In this comparison block 22, 16 comparators C1A1–C1B8 are connected in parallel with analog signal input terminal 34 (FIG. 1a) and reference voltage generation circuit 36 (FIG. 1b); they are divided into the 8 left-side comparators C1A1–C1A8 A group and the 8 right-side comparators C1B1–IB8 B group.

In this case, the reference voltage generation circuit 36 is a ladder network in which a specified number of resistors r of the same resistance are connected in series to reference voltage terminals 38, 40 (FIGS. 1a and 1b). To these reference voltage terminals 38, 40 is applied a relatively low reference voltage VREF,L, and a relatively high reference voltage VREF,H which constitutes a somewhat larger voltage difference than the full range of A/D conversion; this differential voltage (VREF,H–VREF,L) is divided equally by the specified number of resistors r in reference voltage generation circuit 36.

In comparator block 22, 16 comparison reference voltages in ascending voltage increments VIAl–V1A8, V1B1–V1B8 are generated at the 16 taps T1A1–T1A8, T1B1–T1B8 inside reference voltage generation circuit 36. In comparator block 22 the comparison reference voltage V1A1 generated from the left most tap T1A1 is the lowest comparison reference voltage in the full range.

The A group and B group comparators C1A1–C1A8, C1B1–C1B8 are all of the same circuit constitution, and have a pair of outputs, that is a noninverting output and an inverting output, which generate complementary binary logical outputs. These comparators are the type of comparator whose outputs can be connected for wired logic, for example, to output a fixed current.

In group A, the first comparator C1A1 is connected on the first input terminal to tap T1A1, and on the second input terminal to analog signal input terminal 34; the noninverting output is connected to the first of the input terminals of latched comparator LC1 of stage 2 comparator section 14 through line L1, and the inverting output is connected to the second input terminal of the above first latched comparator LC1 through line L1-. Second comparator C1A2 is connected on the first of its input terminals to tap T1A2, and on the second input terminal to analog signal input terminal 34; the noninverting output is connected to the first input terminal of second latched comparator LC2 of stage 2 comparator section 14 through line L2, and the inverting output is connected to the second input terminal of the above latched comparator LC2 through line L2. Third comparator C1A3 is connected on the first of its input terminals to tap T1A3, and on the second input terminal to analog signal input terminal 34; the noninverting output terminal is connected to the first of the input terminals of third latched comparator LC3 (FIG. 3a) of stage 2 comparator section 14 through line L3, and the inverting output terminal is connected to the second input terminal of the above latched comparator LC3 through line L3-. Fourth comparator C1A4 is connected on the first of its input terminals to tap T1A4, and on the second input terminal to analog signal input terminal 34; the noninverting output is connected to the first of the input terminals of latched comparator LC4 (FIG. 3b) of stage 2 comparator section 14 through line L4, and the inverting output is connected to the second input terminal of the above latched comparator LC4 through line L6-. Fifth comparator C1A5 is connected on the first of its input terminals to tap T1A5, and on the second input terminal to analog signal input terminal 34; the noninverting output is connected to the first of the input terminals of latched comparator LC5 (FIG. 4a) of stage 2 comparator section 14 through line L5, and the inverting output is connected to the second input terminal of the above latched comparator LC5 through line L5-. Sixth comparator C1A6 is connected on the first of its input terminals to tap T1A6, and on the second input terminal to analog signal input terminal 34; the noninverting output is connected to the first of the input terminals of latched comparator LC6 (FIG. 4b) of stage 2 comparator section 14 through line L6, and the inverting output is connected to the second input terminal of the above latched comparator LC6 through line L6-. Seventh comparator C1A7 is connected on the first of its input terminals to tap T1A7, and on the second input terminal to analog signal input terminal 34; the noninverting output is connected to the first of the input terminals of latched comparator LC7 (FIG. 5a) of stage 2 comparator section 14 through line L7, and the inverting output is connected to the second input terminal of the above latched comparator LC7 through line L7-. Eighth comparator C1A8 is connected on the first of its input terminals to tap T1A8, and on the second input terminal to analog signal input terminal 34; the noninverting output is connected to the first of the input terminals of latched comparator LC8 (FIG. 5b) of stage 2 comparator section 14 through line LB, and the inverting output is connected to the second input terminal of the above latched comparator LC8 through line L8-.

In group B, the first comparator C1B1 is connected on the first input terminal to tap T1B1, and on the second input terminal to analog signal input terminal 34; the inverting output is connected to the first of the input terminals of latched comparator LC1 through line L1, and the noninverting output is connected to the second input terminal of the above first latched comparator LC1 through line L1-. Second comparator C1B2 is connected on the first of its input terminals to tap T1B2, and on the second input terminal to analog signal input terminal 34; the inverting output terminal is connected to the first of the input terminals of second latched comparator LC2 through line L2, and the noninverting output terminal is connected to the second input terminal of the above latched comparator LC2 through line L2-. Third comparator C1B3 is connected on the first of its input terminals to tap T1B3, and on the second input terminal to analog signal input terminal 34; the inverting output terminal is connected to the first input terminal of third latched comparator LC3 (FIG. 3a) through line L3, and the noninverting output terminal is connected to the second input terminal of the above latched comparator LC3 through line L3-. Fourth comparator C1B4 is connected on the first of its input terminals to tap T1B4, and on the second input terminal to analog signal input terminal 34; the inverting output is connected to the first input terminal of latched comparator LC4 (FIG. 3b) of stage 2 comparator section 14 through line L4, and the noninverting output is connected to the second input terminal of the above latched comparator LC4 through line L4-. Fifth comparator C1B5 is connected on the first of its input terminals to tap T1B5, and on the second input terminal to analog signal input terminal 34; the inverting output is connected to the first input terminal of latched comparator LC5 (FIG. 4a) of stage 2 comparator section 14 through line L5, and the noninverting output is connected to the second input terminal of the above latched comparator LC5 through line L5. Sixth comparator C1B6 is connected on the first of its input terminals to tap T1B6, and on the second input terminal to analog signal input terminal 34; the inverting output is connected to the first input terminal of latched comparator LC6 (FIG. 4b) of stage 2 comparator section 14 through line L6, and the noninverting output is connected to the second input terminal of the above latched comparator LC6 through line L6-. Seventh comparator C1B7 is connected on the first of its input terminals to tap T1B7, and on the second input terminal to analog signal input terminal 34; the inverting output is connected to the first input terminal of latched comparator LC7 (FIG. 5a) of stage 2 comparator section 14 through line L7, and the noninverting output is connected to the second input terminal of the above latched comparator LC7 through line L7-. Eighth comparator C1B8 is connected on the first of its input terminals to tap T1B8, and on the second input terminal to analog signal input terminal 34; the inverting output is connected to the first input terminal of latched comparator LC8 (FIG. 5) of stage 2 comparator section 14 through line L8, and the noninverting output is connected to the second input terminal of the above latched comparator LC8 through line L8-.

In this manner, the first-eighth comparators C1A1–C1A8 and C1B1–C1B8 in both groups A and B are connected respectively to first-8 latched comparators LC1–LC8 of stage 2 comparator section 14; but each comparator C1Ai in group A is respectively connected on the non inverting output terminal and inverting output terminal to the corresponding first and second input terminals of latched comparator LCi, whereas each comparator C1Bi of group B is respectively connected on the inverting output terminal and noninverting output terminal to the first and second input terminals of latched comparator LCi. Put another way, looked at from the side of the stage 2 comparator section 14, the Nth latched comparator LCN is connected on its first input terminal to the noninverting output of the Nth group A comparator C1AN and to the inverting output of the Nth group B comparator C1BN while on its second input terminal it is connected to the inverting output of the Nth group A comparator C1AN and to the noninverting output of the Nth group B comparator C1BN.

FIGS. 3a, 3b, 4a, 4b and and 5a, 5b show the circuit constitutions of second, third, and fourth comparator blocks 24, 26, and 28. Each of these comparator blocks 24, 26, and 28 has the same circuit constitution as first comparator block 22 described above, except for the differing taps, which is to say the different comparison reference voltage values, on reference voltage generation circuit 36.

In other words, in these second, third, and fourth comparator blocks 24, 26, and 28, the 16 comparators (C2A1–C2B8), (C3A1–C3B8), (C4A1–C4B8) are connected in parallel with analog signal input terminal 34 (FIG. 1a) and reference voltage generation circuit 36 (FIG. 1b), and are divided into group A comprising 8 comparators on the left (C2A1–C2A8), (C3A1–C3A8), (C4A1–C4A8) and group B comprising 8 comparators on the right (C4B1–C4B8) [sic; (C3B1–C3B8), (C4B1–C4B8). In first-eighth group A comparators (C2A1–C2A8), (C3A1–C3A8), (C4A1–C4AS) are connected on the noninverting output to the first side input terminals on second first-eighth latched comparators LC1–LC8 of stage 2 comparator section 14, and on the inverting output to the second side input terminals on second first-eighth latched comparators LC1–LC8 of stage 2 comparator section 14. In contrast, in group B, first-eighth comparators (C2B1–C2B8), (C3B1–C3B8), (C4B1–C4BS) are connected on the inverting output to the first side input terminals on second first-eighth latched comparators LC1–LC8 of stage 2 comparator section 14, and on the noninverting output to the second side input terminals on second first-eighth latched comparators LC1–LC8 of stage 2 comparator section 14. That is to say, looking at it from the side of the stage 2 comparator section 14, the Nth latched comparator LCN is connected on its first input terminal to the noninverting output of the Nth comparators C2AN, C3AN, C4AN of comparator blocks 24, 26, 28 of group A and to the inverting output of the Nth comparators C2BN, C3BN, C4BN of comparator blocks 24, 26, 28 of group B, while on its second input terminal is connected to the inverting output of the Nth comparators C2AN, C3AN, C4AN of group A and to the noninverting output of the Nth comparators C2BN, C3BN, C4BN of group B. In fourth comparator block 28 shown in FIGS. 5a and 5b, the comparison reference voltage V4B8 from rightmost tap T4B8 is the comparison reference voltage with the highest voltage value in the full range.

FIG. 6 shows the circuit constitution for dummy comparator block 30. In this dummy comparator block 30, the 4 comparators CDA1–CDA4 are connected in parallel with analog signal input terminal 34 (FIG. 1a) and reference voltage generation circuit 36 (FIG. 1b). To the input terminals on the first side of these comparators CDA1–CDA4 are applied comparison reference voltages VDA1–VDA4 from taps TDA1–TDA4 of reference voltage generation circuit 36, in stepped ascending increments of fixed value outside of the full range; to the input terminals on the second side are applied the analog signal VIN from analog signal input terminal 34 through line L9.

The noninverting and inverting output terminals of the 4 comparators CDA1–CDA4 in dummy comparator block 30 are connected in series to the noninverting and inverting output terminals of group A comparators (C1A1–C1A4), (C2A1–C2A4), (C3A1–C3A4), (C4A1–C4A4) through lines L1 to L4 and L1- to L4-. Therefore the first side input terminal and second side input terminal of the first latched converter LC1 in second comparator section 14 are respectively connected to the noninverting output terminal and inverting output terminal of comparator CDA1; the first side input terminal and second side input terminal of the second latched converter LC2 are respectively connected to the noninverting output terminal and inverting output terminal of comparator CDA2; the first side input terminal and second side input terminal of the third latched converter LC3 are respectively connected to the noninverting output terminal and inverting output terminal of comparator CDA3; the first side input terminal and second side input terminal of the fourth latched converter LC4 are respectively connected to the noninverting input terminal and inverting input terminal of comparator CDA4.

FIG. 7 shows the circuit constitution of dummy comparator block 32. In this dummy comparator block 32, the 4 comparators CDB5–CDB8 are connected in parallel with analog signal input terminal 34 (FIG. 1a) and reference voltage generation circuit 36. To the input terminals on the first side of these comparators CDB5–CDB8 are applied comparison reference voltages VDB5–VDB8 from taps TDA5–TDB8 of reference voltage generation circuit 36, in stepped ascending increments of fixed value below the full range; to the input terminals on the second side are applied the analog signal VIN from analog signal input terminal 34 through line L9.

The inverting and noninverting output terminals of the 4 comparators CDB5–CDB8 in dummy comparator block 32 are connected in series to the inverting and noninverting output terminals of the fifth-eighth comparators of group B (C1B5–C1BS), (C2B5–C2BS), (C3B5–C3B8), (C4B5–C4B8) through lines L5 to L8 and L5⁻ to L8⁻ in the first-fourth comparator blocks 22–28. Therefore the first side input terminal and second side input terminal of the fifth latched converter LC5 in second comparator section 14 are respectively connected to the inverting output terminal and noninverting output terminal of comparator CDB5; the first side input terminal and second side input terminal of the sixth latched converter LC6 are respectively connected to the inverting output terminal and noninverting output terminal of comparator CDB6; the first side output terminal and second side output terminal of the seventh latched converter LC7 are respectively connected to the inverting output terminal and noninverting output terminal of comparator CDB7; the first side input terminal and second side input terminal of the eighth latched converter LC8 are respectively connected to the inverting output terminal and noninverting output terminal of comparator CDB8.

In FIGS. 1a and 1b, adder 12 is formed by the connection of 16 resistors (R1a,R1b)–(R8a,RSb) of approximately equal resistance between the paired input terminals and power supply voltage terminals 42 of first-eighth latched comparator LC1–LC8 in second adder 14. For example, in the first resistor pair (R1a,R1b), the first resistor R1a is connected on one side to power supply voltage terminal 42, and on the other side to one side (the left side) input terminal of first LC1 through line LV, while at the same time being connected through line L1 to the first-fourth comparator blocks 22–28 first group A comparator C1A1–C4A1 noninverting output terminals and the first group B comparator C1B1–C4B1 inverting output terminals, and to the noninverting output terminals of dummy block 30 comparator CDA1. The other resistor R1b of the resistor pair (R1a,R1b) is connected on one side to power supply voltage terminal 42, and on the other side to one side (the right side) input terminal of first LC1 through line LV, while at the same time being connected through line L1 to the first-fourth comparator blocks 22–28 the first group A comparator C1A1–C4A1 inverting output terminals and the first group B comparator C1B1–C4B1 noninverting output terminals, and to the inverting output terminals of dummy block 30 comparator CDA1. In the eighth resistor pair (RSa,RSb), the first resistor RSa is connected on one side to power supply voltage terminal 42, and on the other side to one side (the left side) input terminal of eighth LC8 through line LV, while at the same time being connected through Line L8 to the first-fourth comparator blocks 22–28 the eighth group A comparator C1A8–C4A8 noninverting output terminals and the eighth group B comparator C1BS–C4B8 inverting output terminals, and to the noninverting output terminals of dummy block 32 comparator CDB8. The other resistor R8b of the resistor pair (R8a,R8b) is connected on one side to power supply voltage terminal 42, and on the other side to one side (the right side) input terminal of eighth LC8 through line LV, while at the same time being connected through line L8 to the first-fourth comparator blocks eighth 22–28 group A comparator C1A8–C4A8 inverting output terminals and eighth group B comparator C1B8–C4B8 noninverting output terminals, and to the inverting output terminals of dummy block 32 comparator CDA1.

Second comparator section 14 first-eighth latched comparator LC1–LC8 each has a pair of output terminals, that is noninverting output terminals, which generate complementary binary logical outputs; these hold their outputs at the instant a CLK is input from clock buffer 44.

Pre-encoder 16 is composed of 16 NOR circuits divided into groups A and B: NA1–NA8, NB1–NB8. In group A (NA1–NA8), the Nth NOR circuit NAN is connected on one (left) input terminal to the second comparator section 14 Nth latched comparator LCN noninverting output terminal, and on the other (right) input terminal to the second comparator section 14 (N+1)th latched comparator LCN+1 inverting output terminal. However, while the input terminal of the eighth NOR circuit NA8 is connected on one side (left side) to the corresponding eighth latched comparator LC8 noninverting output, the other (right) side input terminal is connected to the noninverting output of the first latched comparator LC1. In group B (NB1–NB8), the Nth NOR circuit NBN is connected on one (left) input terminal to the second comparator section 14Nth latched comparator LCN inverting output, and on the other (right) input terminal to the second comparator section 14 (N+1)th latched comparator LCN+1 noninverting output. However, while the input terminal of the eighth NOR circuit NB8 is connected on one side (left side) to the corresponding eighth latched comparator LC8 inverting output terminal, the other (right) side input terminal is connected to the noninverting output of the second latched comparator LC2.

First-eighth group A NOR circuit NA1–NA8 output terminals and first-eighth group B NOR circuit NB1–NB8 output terminals are connected respectively to the first-eighth input terminals on lower encoder 18. The lower encoder 18 can be made by expanding the 4-bit type shown in FIG. 21 to 8 bits; it is constituted such that when an H level output voltage is exclusively obtained at only one of the output terminals NA1–NA8, NB1–NB8 of either group A or B, a preassigned 3-bit data item will be output to the (Nth) encoder input connected to that output. For example, if an H level is exclusively obtained on the first group A NOR circuit AN1 output, the preassigned 3-bit data "000" will be output on the first input terminal.

The operation of the lower A/D conversion section in the A/D converter of this invention will now be explained, with reference to FIGS. 8–12.

Figure 8:
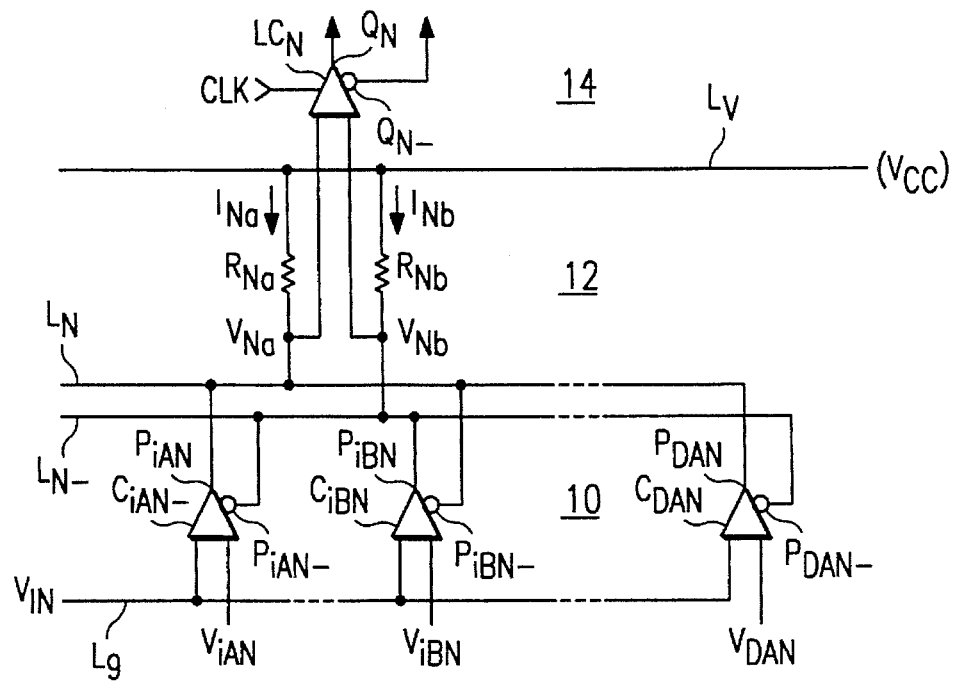
FIG. 8 is a circuit diagram showing a lower A/D conversion section in the embodiment of FIGS. 1a and 1b.

FIG. 8 depicts the interconnection between the first–fourth selectable (Nth) comparators CiAN, CiBN in groups A and B in the selectable first comparator block in comparator section 10, the comparator CDAN in dummy comparator block 30, the Nth resistors RNa, RNb in adder 12, and the Nth latched comparator LCN in the second comparator section 14. Comparison reference voltages ViAN, ViBN, VDAi are applied to one side input terminal of comparators CiAn, CiBn, and CDAN from reference voltage generation circuit 36 (not shown); to the other input terminal, an analog signal VIN is applied from analog signal input terminal 34 through line L9.

These comparators CiAN, CiBN, CDAN compare the analog signal voltage level VIN to the comparison reference voltages ViAN, ViBN, VDAi; when the former (VIN) is higher than the latter (ViAN, ViBN, VDAi), their noninverting output terminals go to an H level and their inverting output terminals PiAN-, PiBN-, and PDAi- go to an L level; when the former is lower than the latter, each output voltage goes to an inverted logic level. The inverting output and noninverting output of each comparator is an open collector, so for an L level, a fixed current i is sourced from power supply line L9 through the resistors RNa or RNb on adder 12; for an H level this current is not sourced.

Therefore in response to the input analog signal VIN voltage level, complementary binary logical outputs are obtained at the noninverting and inverting output terminals (PiAN,PiAN-), (PiBN,PiBN-), (PDAN,PDAN-) of these 3 comparators CiAN, CiBN, CDAN, and by the sourcing of current i through power supply line L9 from the resistors RNa or RNb on adder 12 at the output at level L, a voltage VNA, VNB is obtained on the terminals of second side of the first comparator section 10 side of the two resistors RNa, RNb in response to the amount of current INa, INb. These voltages VNA, VNB are compared in the second comparator section 14 latched comparator LCN, and the result is obtained as a complementary binary logical output at noninverting output and inverting output Q1a, Q1b.

FIG. 9 shows the values for each part of FIG. 8 under different input analog signal voltage levels VIN. When the analog signal VIN is lower than the comparison reference voltage ViAN at comparator CiAN (case (1)), the noninverting output of comparators CiAN, CiBN, and CDAN will each go to an H level, and the inverting outputs to an L level, and current i will flow at each of the inverting outputs. Therefore in adder 12 the current i sourced at the inverting output PiBN of comparator CiBN will flow to resistor RNa, and current i sourced respectively from the inverting output terminals PiAN-, PDAN- of comparators CiAN, CDAN will flow to resistor RNab. As a result, the input voltages VNa, VNb on latched comparator LCN will be (Vcc–Ri) and (Vcc–2Ri) respectively, and H level and L level output voltages will be respectively obtained at noninverting output QN and inverting output QN-.

In the case where the analog signal VIN is higher than the comparison reference voltage ViANat comparator CiAN and lower than the comparison reference voltage ViBN at comparator CiBN (case (2)), the output terminals of comparator CiAN (PiAN,PiAN-) are simply inverted, and (PiBN,PiBN-), (PDANN,PDAN-) of comparators CiBN, CDAN are as described in case (1) above. Therefore in adder 12 the current i sourced respectively from the inverting output PiBN-, of comparators CiAN, CiBN will flow to resistor RNa, and a current i sourced at comparator CDAN inverting output PDAN will flow to resistor RNab. As a result, the input voltages VNa, VNb on latched comparator LCN will be (Vcc–2Ri) and (Vcc–Ri) respectively, and L level and H level output voltages will be respectively obtained at noninverting output QN and inverting output QN-.

Figure 10:
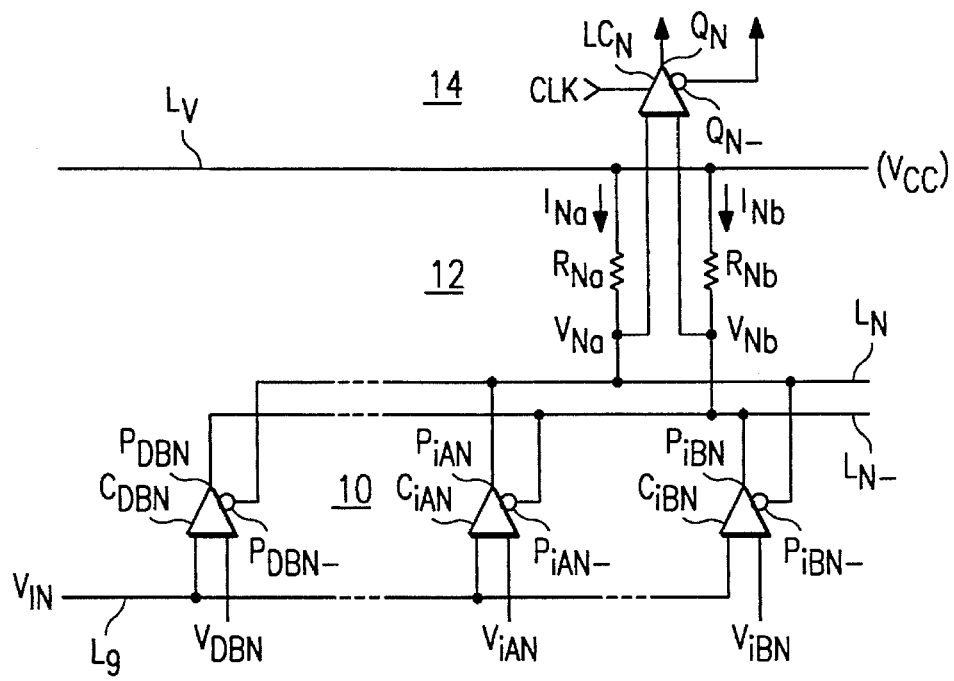
FIG. 10 is a circuit diagram showing a lower A/D conversion section in the embodiment of FIGS. 1a and 1b.

In a similar operation, for the case where the analog signal VIN is higher than the comparison reference voltage ViBN at comparator CiBN and lower than the comparison reference voltage VDAN at comparator CDAN (case (3)), the noninverting output QN and the inverting output QN- of latched comparator LCN will respectively go to an H and L level; in the case where input analog signal VIN is higher than the comparison reference voltage VDA at comparator CDAN (case (4)), the noninverting output QN and the inverting output QN- of latched comparator LCN will respectively go to an L and H level FIG. 10 depicts the interconnection between the fifth-eighth selectable (Nth) comparators CiAN, CiBN in groups A and B in the selectable first comparator block in comparator section 10, the comparator CDBN in dummy comparator block 32, the Nth resistors RNa, RNb in adder 12, and the Nth latched comparator LCN in the second comparator section 14. The difference from FIG. 8 is that the dummy comparator which connects in series the output terminals to the Nth comparators CiAN, CiBN in groups A and B of each comparator block has changed from the right-hand dummy block 30 comparator CDAN to the left-hand dummy block 32 comparator CDBN.

FIG. 11 shows the values at each point in FIG. 10 for various input analog signal VIN voltage levels. Looking at comparators CiAN, CiBN in groups A and B in each comparator block, cases (2), (3), and (4) in FIG. 11 correspond to cases (1), (2), and (3) in FIG. 9.

In FIGS. 9 and 11, the values for currents INa, INb at adder 12 Nth resistors RNa, RNb, and of terminal voltages VNa, VNb are synthesized from the 3 comparators shown in FIGS. 8 and 10, that is, from comparator block Nth group A and B comparators CiAN, CiBN and the corresponding comparator CDAN (CDBN) inside the dummy comparator block 30 (32); the output terminals of Nth group A and B comparators of all other blocks connected in series to adder 12 resistors RNa, RNb and to second comparator section 14 Nth latched comparator LCN through lines LN, LN- are ignored.

In actuality, Nth group A and group B comparators also source a current i at the complementary binary logical output L level, and a source current i flows respectively at adder 12 Nth resistors RNa, RNb, multiplied by the number of comparator blocks; the sum of these multiple currents i becomes the value of the current quantity INa, INb. However, in each comparator block the noninverting output and inverting output of the Nth group A comparator CiAN are respectively connected to adder 12 resistors RNa, RNb, and the inverting output and noninverting output of the Nth group B comparator CiBN are respectively connected to adder 12 resistors RNa, RNb, so the difference (relative values) between the amount of current INa, INb at resistors RNa, RNb are the values of only the unit sourced current i of each case shown in FIGS. 8 and 11. Put precisely, in cases (1)–(4), the amount of current (INa,INb) through resistors RNa, RNb is (4$i$,5$i$), or (5$i$,4$i$). From this we see that the differential voltage between terminal voltages VNa, VNb on resistors RNa, RNb will be differential voltage Ri, corresponding to the voltage drop proportional to the unit sourced current i, as in each of the cases in FIGS. 9 and 11; the result is that the same binary logical outputs on latched comparator LCN output terminals QN, QN- are obtained as in each of the cases in FIGS. 9 and 11.

From the above operation, the following may be understood. In each comparator block 22–28, when the input analog signal VIN voltage level is lower than the lowest comparison reference voltage ViA1, or higher than the highest comparison reference voltage ViB8 in these same blocks, that is, when it is outside the comparison reference voltage range (ViAI–ViBS) of these blocks, there will be no effect whatsoever on any of the comparators in either group A or group B of these blocks, nor on the comparison results of second comparator section 14 latched comparators LC1–LC8, nor will there be any effect, wholly or partially, on these comparator blocks or on the output of second comparator section 14. However, as is shown in FIGS. 12 and 13, when the input analog signal VIN is within the comparison reference voltage range (ViA1–ViBS) of these blocks, the comparison results of CiA1–CiA8 of group A or CiB1–CiB8 of group B will be reflected in the binary logical outputs of comparator section 14 first through eighth latched comparators LC1–LC8.

In FIG. 12, Q1 through Q8 represent the noninverting output voltage levels for the first-eighth latched comparators LC1–LC8 on the second comparator section 14; $Q_1$- through $Q_8$- represent the noninverting output voltage levels for the first-eighth latched comparators LC1–LC8; NA1–NA8 show the output voltage levels of the group A NOR circuits NA1–NA8 in pre-encoder 16; NB1–NB8 represent the output voltage levels of the group B NOR circuits NB1–NB8 in pre-encoder 16.

As shown in FIG. 12, when the input analog voltage VIN voltage level is between the comparison reference voltage ViAN at the Nth comparator CiAN in group A of any of the first-fourth comparator blocks 22–28 and the comparison reference voltage ViAN+1 of (N+1)th comparator CiAN+1, an H level is exclusively obtained on the Nth group A NOR circuit NAN output only. When the input analog voltage VIN voltage level is between the comparison reference voltage ViBN at the Nth comparator CiBN in group B of any of the first-fourth comparator blocks 22–28 and the comparison reference voltage ViBN+1 of (N+1)th comparator CiBN+1, an H level is exclusively obtained on the Nth group B NOR circuit NBN output only. In this manner, when a single H level output voltage is exclusively obtained at group A NOR circuits NA1–NA8 or group B NOR circuits NB1–NB8 of upstage encoder 16, lower encoder 18 will output the preassigned 3-bit lower bits to the encoder input terminal where that H level binary logical output is input. For example, when NA8–NA1 is (00000001), it will output the lower 3-bits "000"; when NA8–NA1 is (00000010), it will output the 3-bits "001." As is shown in FIG. 12, when an H level output voltage is obtained from one of the group A NOR circuits NA1–NA8, all the group B NOR circuit NB1–NB8 output terminals go to an L level; conversely, when an H level output voltage is obtained from one of the group B NOR circuits NB1–NB8, all the group A NOR circuit NA1–NA8 output terminals go to an L level.

In this manner, the lower A/D conversion section of this embodiment is divided into 4 groups of comparator blocks 22–28, each with 16 comparators which compare the input analog signal VIN with 64 comparison reference voltages of 64 stepped, equal ascending voltage values within a full range scale; in each comparator block the 16 comparators are divided into an A group and a B group. Also, there are 2 dummy comparator blocks 30, 32—one on each side of comparator blocks 22–28—in which 8 comparators compare input analog voltage VIN with 8 stepped, equal ascending voltage values outside the full scale range. Both the comparators in comparator blocks 22–28 and dummy comparator blocks 30,32 have inverted and noninverted output terminals which output complementary binary logical outputs. In each comparator block 22–28, the inverting and noninverting output terminals of the Nth group A comparator CiAN are connected, respectively, to the Nth resistors RNa and RNb on adder 12, and to the first and second input terminals of comparator section 14 Nth latched comparator LCN; the inverting and noninverting output terminals of the Nth group B comparator CiBN are connected, respectively, to the Nth resistors RNa and RNb on adder 12, and to the first and second input terminals of the comparator section 14 Nth latched comparator LCN. The noninverting and inverting output terminals on each of the 4 comparators CDA1–CDA4 in dummy comparator block 32, which receives the high voltage values from dummy comparison reference voltages VDA1–VDA4, are respectively connected in common with the noninverting output terminals and inverting output terminals of group A first-fourth comparators CiA1–CiA4 in comparator block 22–28. The noninverting and inverting output terminals on each of the 4 comparators CDB1–CDB4 in dummy comparator block 30, which receives the low voltage values from dummy comparison reference voltages VDB1–VDB4, are respectively connected in common with the noninverting output terminals and inverting output terminals of first-fourth group B comparators CiB1–CiB4 in comparator block 22–28.

In this constitution, as previously described, when the input analog signal VIN voltage level is within the comparison reference voltage range (ViA1–ViB8) in a selectable comparator block or, more precisely, when it is within the A group comparison reference voltage range (ViA1–ViA8) or the group B comparison reference voltage range (ViBI–ViB8), a binary logical output corresponding to the comparison output values of the 8 group A comparators CiA1–CiA8 or the 8 group B comparators CiB1–CiB8 will be obtained on the output terminals of the 8 latched comparators LC1–LC8 of stage 2 comparator section 14. In this way, a lower 3-bit binary logical output corresponding to the comparison output value for the 8 group A comparators CiA1–CiA8 or the 8 group B comparators CiB1–CiB8 will be obtained in the output terminal of the 8 latched comparators LC1–LC8 on the second comparator section 14, even if the input analog signal VIN is within the A group comparison reference voltage range (ViAi–ViA8) or the B group comparison reference voltage range (ViAi–ViA8) [sic; ViBi–ViBS] of the selected block.

Therefore the 64 comparators of this embodiment have been divided into 4 comparator blocks of 16 comparators; even if we divided 128 comparators into 8 blocks of 16 comparators, 8 of the stage 2 comparator section 14 latched comparators would suffice, so 8 input terminals would also suffice for lower encoder 18. In the case, for example, where we divide 64 comparators into 8 comparator block groups of 8 comparators, these 8 comparators would be further divided into A and B groups of 4 comparators each, so 4 stage 2 comparator section 14 latched comparators would suffice, and 4 input terminals would be sufficient for lower encoder 18. It is possible then, in the lower A/D converter of this embodiment, to increase resolution by increasing the number of comparators without increasing the number of encoder input terminals.

8 comparators CDA1–CDA4, CDB1–CDB4, which compare input analog signal VIN with dummy comparison reference voltage VDA1–VDA4, VDB1–VDB4 outside of the full scale range have been placed in dummy comparator blocks 30, 32 on either side of comparator block 22–28. The application of the complementary binary logical output from these 8 dummy comparators CDA1–CDA4, CDB1–CDB4 on the 12 resistor pairs (R1a, R1b)–(R4a, R4b), (R5a, R5b)–(R8a,R8b) of adder 12 results in the logic [values]

shown in FIGS. 9 and 11. However, it is not possible, by definition, to do an A/D conversion outside of the full scale range, so it is not necessary to separately consider cases (4) in FIG. 9 or (1) in FIG. 11. Therefore even if the same fixed complementary binary logical outputs as seen in FIG. 9, cases (1),(2), (3) and FIG. 11, cases (2), (3), (4) are output continuously from comparators CDA1–CDA4, CDB1–CDB4, irrespective of input analog voltage VIN; so long as A/D conversion is done only within the full scale range, there is no particular problem. This means that it is not necessary to connect the input terminals of comparators CDA1–CDA4, CDB1–CDB4 to analog signal input terminal 34 and, furthermore, that one may use another circuit of one's choice in place of these comparators CDA1–CDA4, CDB1–CDB4 to apply a fixed complementary binary logical output to the resistor pairs (R1a, R1b)–(R4a, R4b), (R5a, R5b)–(RSa,RSb) of adder 12.

Next, the upper A/D conversion section of the flash A/D converter of this embodiment will be explained. As described above, the lower A/D conversion section of this embodiment outputs a lower 3-bit data item which indicates what the input analog signal VIN voltage level is within the comparison reference voltage range in the A or B group within any one of the comparator blocks. Therefore the upper A/D conversion portion should generate an upper 3-bit data item which indicates whether the input analog signal VIN voltage level is within the comparison reference voltage range in the A or B group within any one of the comparator blocks. It thereby becomes possible, by comparing the input analog signal VIN voltage level to a comparison reference voltage at the transition point between 3 blocks or the transition point between groups A and B, to determine the position of the input analog signal VIN voltage level within the comparison reference voltage range. However with this method a small inaccuracy in the comparator can cause an error such as a second block, group B being misinterpreted as a third block, group A. This kind of higher bit error causes a large error in the digital signal.

In the upper A/D conversion section of this embodiment, special care has been taken in the positioning of the comparator connections and in the selection of comparison reference voltages, making it possible to avoid that kind of upper bit error and obtain a highly accurate upper bit data.

In FIGS. 1a and 1b, the upper A/D conversion section of this embodiment comprises a comparator section 50, made up of 9 latched comparators UC0–UC9 connected in parallel with analog signal input terminal 34 and reference voltage terminal 36, pre-encoder 52, which converts the specified number of binary logical outputs from this comparator section 50 into 9 binary logical outputs readable by lower encoder 54, an upper encoder 54 made up of a pair of encoders which code the binary logical outputs from this pre-encoder 52 into a 3-bit digital signal in accordance with the specified conversion pattern, a pair of 8-input OR circuits 56, 58, which logically sum the outputs of the 8 NOR circuits of group A and group B NA1–NA8, NB1–NB8 from the pre-encoder 16 of the lower A/D conversion section described above, a selector 60, which selects one upper 3-bit data item from the pair of 3-bit data item given by upper encoder 54, based on the output signal from these OR circuits 56, 58, and an output buffer 62 which synchronizes or synthesizes the upper 3-bit data item selected by selector 60 with the lower bits.

In comparator section 50, in one side of the input terminals on latched comparators UC0–UC8, comparison reference voltages VDBC, V1AC, V1BC, V2AC, V2BC, V3AC, V3BC, V4AC, V4BC are applied from taps TDBC, T1AC, T1BC, T2AC, T2BC, T3AC, T3BC, T4AC, T4BC of the A and B groups of the first-fourth comparator blocks 22–28 or the reference voltage generation circuit 36 dummy comparator block 32. These comparison reference voltages VDBC, V1AC, V1BC, V2AC, V2BC, V3AC, V3BC, V4AC, V4BC are at the midpoints of the comparison reference voltage ranges for groups A and B in each block. For example, V1AC has a value of (V1A8–V1A1)/2. To the other input terminals of latched comparators UC0–UC8 is applied input analog signal VIN from analog signal input terminal 34 via power supply line LE.

When the input analog signal VIN is lower than the comparison reference voltage, the noninverting output of each latched comparator UCi will generate an H level and the inverting output an L level; when the input analog signal VIN is higher than the comparison reference voltage, the inverting output will generate an L level and the noninverting output an H level. These binary outputs are synchronized to the clock timing from clock buffer 44 with the outputs of each latched comparator LC1 in second comparator 14 of the lower A/D conversion section. For example, latched comparator UC5 gives an H level on the noninverting output and L level on the inverting output when the input analog signal VIN is lower than comparison reference voltage V3AC; it gives an L level on the noninverting output and an H level on the inverting output when the input analog signal VIN is higher than comparison reference voltage V3AC. When the noninverting output of latched comparator UC5 is an H and its inverting output is an L, all the latched comparators UC6–UC8 above go to an H on the noninverting output and an L on the inverting output terminal; when latched comparator UC5 noninverting output is an L and its inverting output is an H, all the latched comparators UC0, UC1–UC4 below it go to an L on the noninverting output and an H on the inverting output terminal.

Pre-encoder 52 is made up of 9 NOR circuits NE0–NE8 connected in parallel between latched comparators UC0–UC8 of comparator section 50 and the 9 input terminals of upper encoder 54. In pre-encoder 52, one side of the input terminal (left side in the figure) of the Nth NOR circuit NEN is connected to the noninverting output of the Nth latched comparator UCN of comparator section 50, and the input terminal of the other side (right side in the figure) is connected to the inverting output terminal of (N+1)th latched comparator UCN+1 of comparator section 50. However, both one side (left) and the other side (right) of the 9th NOR circuit NE8 are connected to the noninverting output of ninth latched comparator LC8.

In pre-encoder 52, an H level output voltage is obtained exclusively at the output of the Nth NOR circuit NEN, corresponding to the uppermost Nth latched comparator UCi which generates the H level output voltage from the noninverting output in comparator section 50. For example, when all the noninverting output terminals on latched comparators UC0–UC5 are H and all the noninverting output terminals in latched comparators UC6–UC8 are L, then only the output of the NOR circuit NE5 corresponding to latched comparator UC5 will be at H level, and the output terminals of all the other NOR circuits NE0–NE4, NE6–NE8 will be at L level.

In upper encoder 54, one of the 3-bit encoders is constituted so as to output the respective 3-bit data item (000), (000), (010), (010), (100), (100), (110), (110), (111) when the NOR circuits NE0–NE8 of pre-encoder 52 output an H level exclusively. The other 3-bit encoder is constituted so as to output the respective 3-bit data items (000), (001), (001), (011) (011), (101), (101), (111), (111) when the NOR circuits NE0–NE8 of pre-encoder 52 output an H level exclusively.

Here (000), (001) are codes assigned respectively to group A and group B in first comparator block 22; (010), (011) are codes assigned respectively to group A and group B in second comparator block 24; (100), (101) are codes assigned respectively to group A and group B in third comparator block 26; (110), (111) are codes assigned respectively to group A and group B in fourth comparator block 28.

When, for example, only the output of NOR circuit NE5 in pre-encoder 52 is at H level, upper bit encoder 54 will output (100), (101) from the 3-bit encoder, signifying the A group and B group, respectively in comparator block 26. Here the fact that only the output of NOR circuit NE5 is at H level means that, as will be understood from FIGS. 4a and 4b, the input analog signal VIN voltage level is higher than the third comparator block 26 group A comparison reference voltage range midpoint V3AC, and lower than the comparison reference voltage range midpoint V3BC of third comparator block 26 group B. In other words, we still don't know whether the input analog signal VIN voltage level is within the comparison reference voltage range of third comparator block 26 group A or the comparison reference voltage range of group B.

However, in the lower A/D conversion section, as discussed above, we do know whether the input analog signal VIN voltage level is within the group A comparison reference voltage range or the group B comparison reference voltage range. For example, as shown in FIG. 12, in pre-encoder 16, when the input analog signal VIN voltage level is within the group A comparison reference voltage range, a single H level is exclusively output on group A NOR circuits NA1–NA8, while all the output terminals of group B NOR circuits NB1–NB8 will be at an L level. When the input analog signal VIN voltage level is within the group B comparison reference voltage range, a single H level is exclusively output on group B NOR circuits NB1–NB8, while all the output terminals of group A NOR circuits NA1–NA8 will be at an L level. These group A and B output states are output in an inverted form on the output terminals of NOR circuits 56, 58.

Therefore in the above example where upper encoder 54 outputs two 3-bit data item (100), (101), selector 60 will select (100), indicating third comparator block, group A, when the output of NOR circuits 56, 58 is (0, 1), and (101), indicating third comparator block, group B, when the output of NOR circuit 56, 58 is (1,0). In the same manner, for example, if only the output of pre-encoder 52 NOR circuit NE2 is at H level, upper encoder 54 will output a 3-bit data item (010) showing second comparator block, group A and a 3-bit data item (001) showing first comparator block, group B; selector 60 will select (010), indicating group A, when the output of NOR circuits 56, 58 is (0, 1), and (001), indicating group B, when the output of NOR circuits 56, 58 is (1,0). In this way the 3-bit data item selected by selector 60 is output by output buffer 62 as the upper bits. As a result, the lower 3-bit data item from lower A/D conversion unit output buffer 20 is combined with the upper 3-bit data item from upper A/D conversion unit output buffer 62, and a 6-bit digital signal is obtained.

So in the upper A/D conversion unit of this embodiment, the input analog signal VIN voltage level is compared to the comparison reference voltages VDBC, V1AC, V1BC, V2AC, V2BC, V3AC, V3BC, V4AC, V4BC corresponding to the midpoints of comparison reference voltage range in the A and B groups of each block 32, 22–28; a determination is made as to what position it belongs to in the comparison reference voltage range in the A and B groups, and finally a determination is made as to whether it belongs to the A or B group, based on A group/B group discrimination data. This means that even the upper A/D conversion section can be obtained as the same degree of resolution in the lower A/D conversion section, and there is little upper bit error. Therefore a high accuracy 6 bit digital signal is obtained.

Also, this upper-bit A/D conversion section operates in sync with the lower-bit A/D conversion section. That is, in the flash A/D converter of this invention, the upper-bit A/D conversion takes place in parallel and simultaneous with the lower-bit A/D conversion. Therefore an extremely high conversion speed is achieved.

In this embodiment the midpoint voltage value of each comparison reference voltage range has been used as the comparison reference voltage for upper A/D conversion, but one is not necessarily limited to the midpoint; in principle it is possible to use any selected voltage value within the comparison reference voltage range as the comparison reference voltage for upper-bit A/D conversion.

Figure 13A:
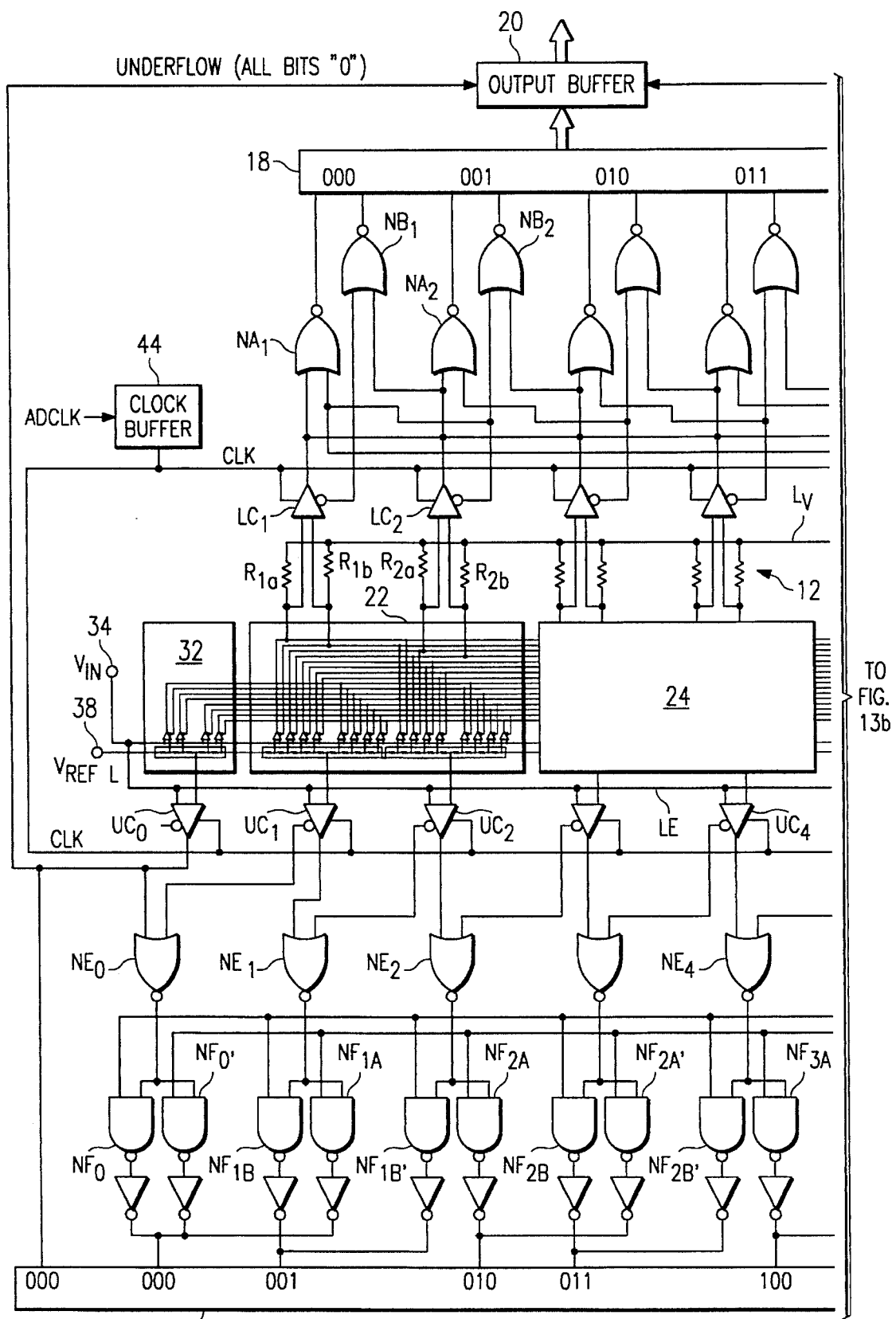
FIGS. 13a and 13b are adjoining segments of is a partially schematic circuit diagram showing a second embodiment of the flash A/D converter in accordance with the invention.
Figure 13B:
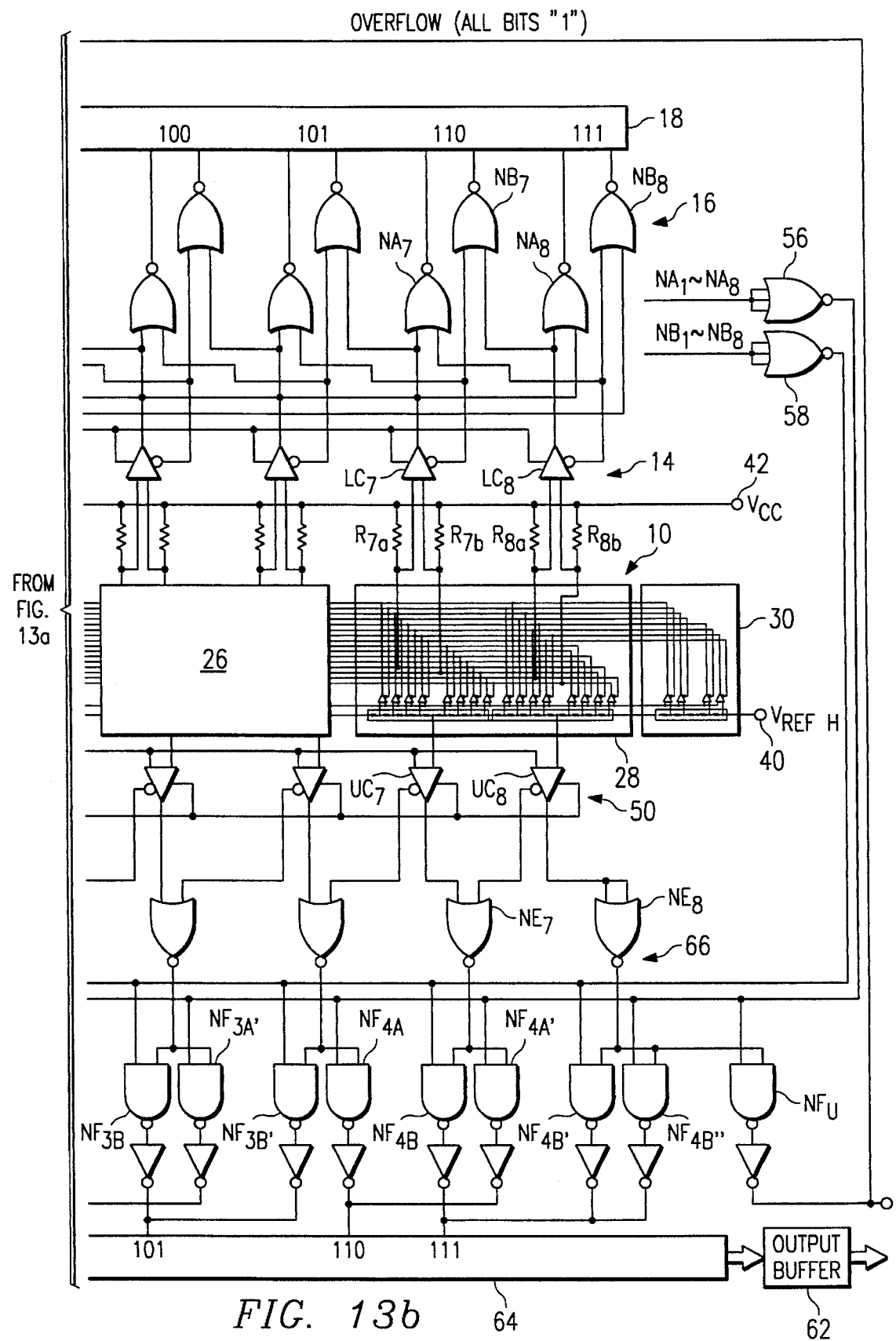

FIGS. 13a and 13b show a second embodiment of the flash A/D converter of embodiment. In this A/D converter, a portion of the aforementioned upper A/D conversion section of the A/D converter of the first embodiment—the pre-encoder and the upper encoder—is modified; the upper encoder circuit is simplified and the output step selector circuit is eliminated. Therefore all other parts of the second embodiment are the same as those of the first embodiment.

In FIG. 13a and 13b, upper encoder 64 is made up of a single 3-bit encoder, which does a table coding of the 8 binary logical outputs from pre-encoder 66. Each input terminal corresponds to group A or B in the first-fourth comparator block 22–28; for example first and second input terminals correspond to group A and group B of first comparator block 22. In pre-encoder 66, the 9 NOR circuits NE0–NE8 form the stage 1 pre-encoder section; a stage 2 pre-encoder section made up of 19 NAND circuits (NFD, NFD')–(NF4B', NF4B", NFU) divided into 9 groups of 2 or 3 is placed between this stage 1 pre-encoder section and upper encoder 64. One of the input terminals of each NAND circuit NF in the stage 2 pre-encoder section is connected to the corresponding stage 1 NOR circuit output terminal NE; the other input terminal is connected to one or the other NOR circuit 56, 58 output terminals, and the output is connected to the corresponding upper encoder 64 input terminal.

In this pre-encoder 66, an H level output voltage is exclusively obtained, for example, on only the output of the 5th NOR circuit NE5 of the stage 1 pre-encoder section. In this case, the H level on NOR circuit NE5 is applied to one of the input terminals of the corresponding stage 2 pre-encoder section NAND circuits NF3B, NF3A'. The other input terminal of NAND circuit NF3B is connected to the output of NOR circuit 58 corresponding to the B group, and the other input terminal of NAND circuit NF3A' is connected to the output of NOR circuit 56 corresponding to the A group. Therefore when the output of NOR circuits 56, 58 is (1,0), that is when the input analog signal VIN is within the group B comparison reference voltage range, an H level is obtained on the output of NAND circuit NF3B, and the output of NAND circuit NF3A' goes to an L level. All other NAND circuits NF are receiving an L level voltage on one input terminal from one of the stage 1 pre-encoder NOR circuits NE other than 5th NOR circuit NE5, so they are at an L level. Therefore in the stage 2 pre-encoder an H level is obtained exclusively at the NAND circuit NF3B output only. This means that a pre-assigned 3-bit data item (101) is output at the input terminal of upper encoder 64 connected to the output of NAND circuit NF3B. This 3-bit data item (101) is a code corresponding to the B group of third comparator block 26; it is transmitted as the upper 3-bit data item to output buffer 62. Similarly, when the output terminals of NOR circuits 56, 58 are (0,1), an H level is obtained on the NAND circuit NF3A' output terminal, and upper encoder 64 outputs a code (100) corresponding to the A group of third comparator block 26.

Thus in the second embodiment, the A group/B group identification data obtained from NOR circuits 56, 58 is input to pre-encoder 66, and 8 binary logical outputs which alternately indicate groups A and B in comparator blocks 22–28 are obtained from the outputs of pre-encoder 66, so the upper encoder 64 can be composed of one 3-bit encoder, and the output step selector (60) can be eliminated.

Figure 14A:
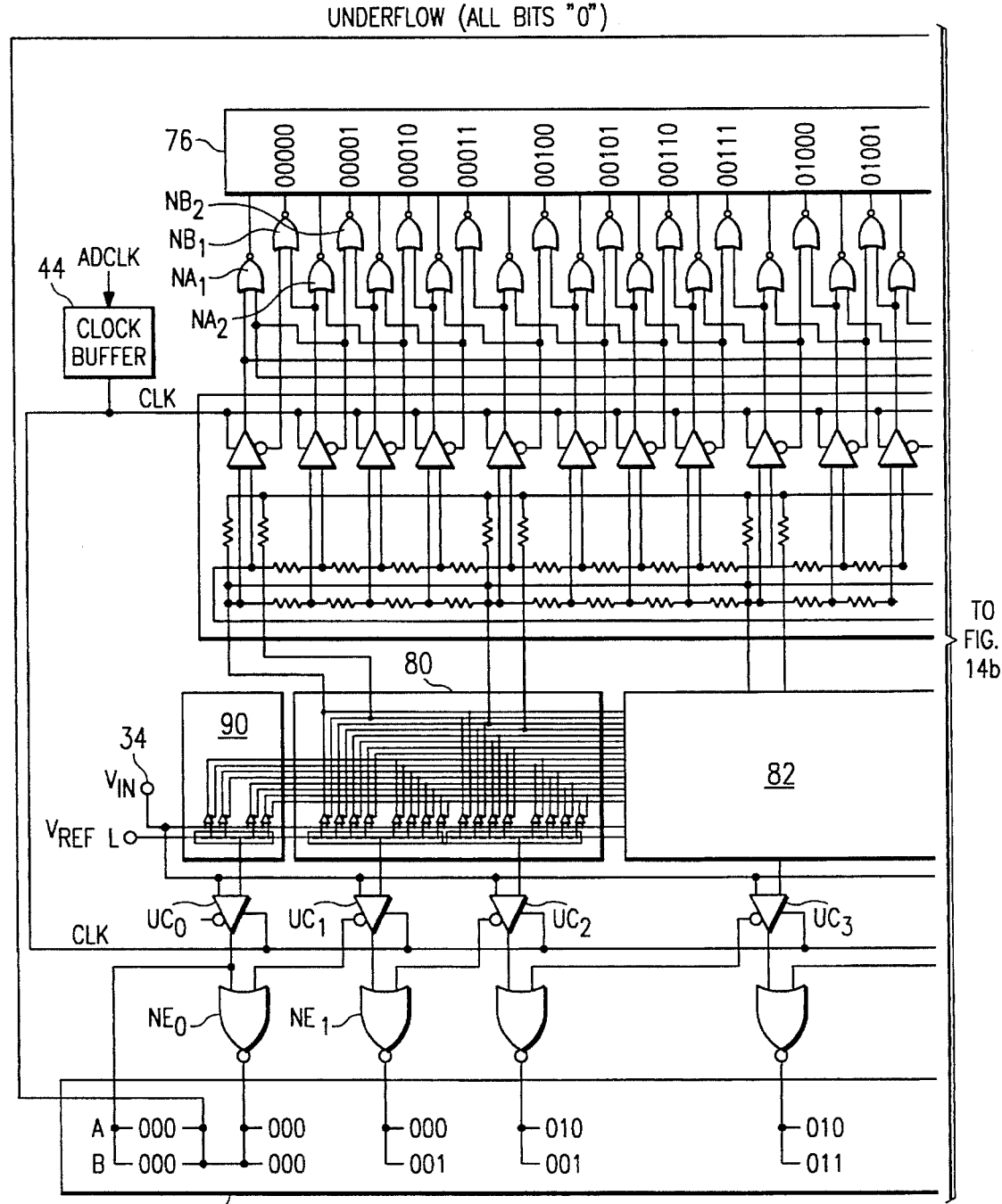
FIGS. 14a, 14b and 14c are adjoining segments of is a partially schematic circuit diagram showing a third embodiment of the flash A/D converter in accordance with the invention.
Figure 14B:
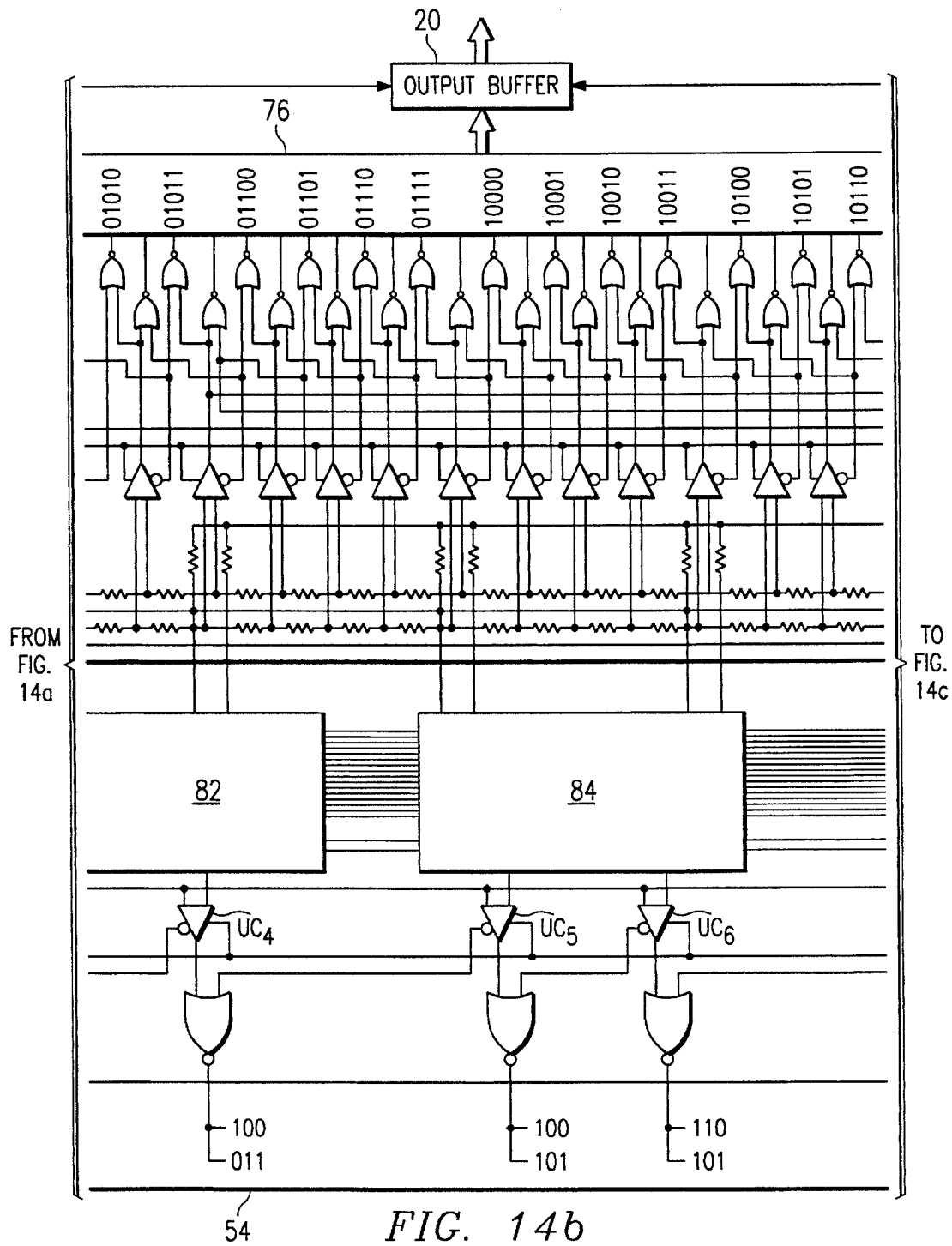
Figure 14C:
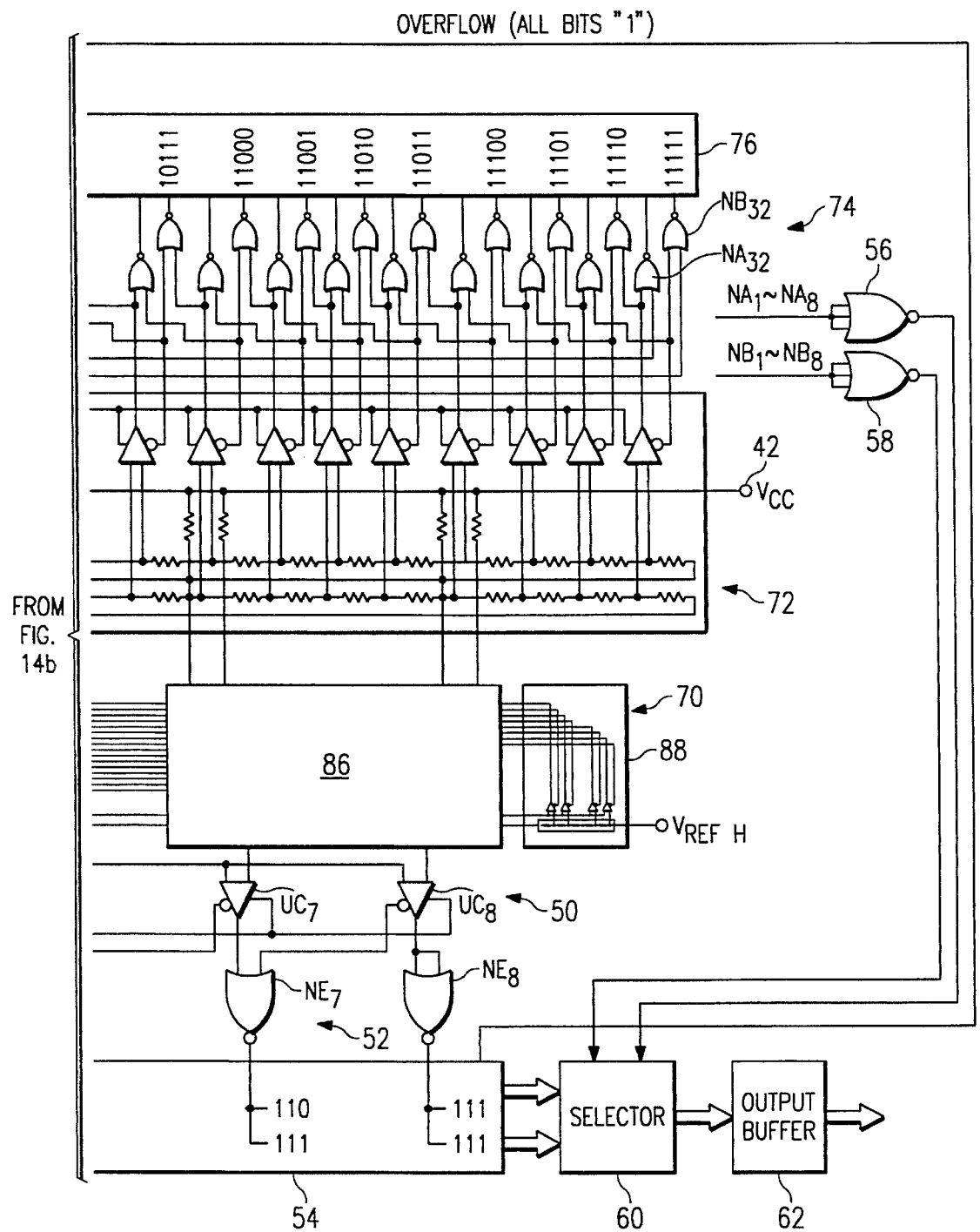

FIGS. 14a, 14b and 14c show a third embodiment the flash A/D converter circuit. In the third embodiment of the A/D converter, an improvement in the resolution of the lower A/D conversion section is achieved without increasing the number of elements in the stage 1 comparator section. In this A/D converter the points which differ from the first embodiment are the first comparator section 70, the block 72 connected to the output side of stage 1 comparator section 70, the pre-encoder 74, and lower encoder 76. In pre-encoder 74, the number of group A comparators NAi and group B comparators NBi has grown in each case to 32 (NA1–NA32), (NB1–NB32). Lower encoder 76 is formed of a 5-bit encoder with 32 input terminals.

FIGS. 15a and 15b show the circuit constitution of block 72. In block 72 a resistor network 75 is added to adder 12 for interpolation, and 24 latched comparators (C1m1, C1m2, C1m3)–(C8m1, C8m2, C8m3) in stage 3 comparator section 77 have been added in parallel to the 8 latched comparators LC1–LC8 in stage 2 comparator section 14.

In resistor network 75, 4 resistors rNa1, rNa2, rNa3, rNa4, connected in series between one side (left side) input terminals of the adjacent latched comparators LCN, LCN+1 of stage 2 comparator section 14, form the first resistor network; 4 resistors rNb1, rNb2, rNb3, rNb4, connected in series between the other side (right side) input terminals of the adjacent latched comparators LCN, LCN+1, form the second resistor network. Four resistors rBa1, rBa2, rBa3, rBa4, connected in series between one (left) input terminal of the eighth [latched] comparator LC8 of stage 2 comparator section 14 and the other (right) input terminal of first latched comparator LC1 of stage 2 comparator section 14, form the third resistor network; 4 resistors r8b1, r8b2, rSb3, r8b4, connected in series between the other side (right side) input terminal of the eighth LCX and the one side (left side) input terminal of first latched comparator LC1 form the fourth resistor network.

In the first resistor network, the nodes between each adjoining pair of resistors (rNa1, rNa2), (rNa2, rNa3), (rNa3, rNa4) are connected to the input terminals on one side (left side) of the corresponding latched comparators (CNm1, CNm2, CNm3) of third comparator section 77. In the second resistor network corresponding to the first resistor network, the nodes between each adjoining pair of resistors (rNb1, rNb2), (rNb2, rNa3), (rNb3, rNb4) are connected to the input terminals on the other side (right side) of the corresponding latched comparators (CNm1, CNm2, CNm3) of third comparator section 77. In the third resistor network, the nodes between each adjoining pair of resistors (r8a1, r8a2), (r8a2, r8a3), (r8a3, rSa4) are connected to the input terminals on one side (left side) of the corresponding latched comparators (C8m1, C8m2, C8m3) of third comparator section 77. In the fourth resistor network corresponding to the third resistor network, the nodes between each adjoining pair of resistors (rSb1, rSb2), (rSb2, rSb3), (rSb3, rSb4) are connected to the input terminals on the other (right side) of the corresponding latched comparators (C8m1, C8m2, C8m3) of third comparator section 77.

In FIGS. 14a, 14b and 14c, stage 1 comparator section 70 is constituted by the stage 1 comparator section 10 dummy comparator block 32 described in the first embodiment, by comparator blocks 22–28, by dummy comparator block 90, in which differential amplifiers (DDB1–DDB4), (D1A1–D1B8), (D2A1–D2B8), (D3A1–D3B8), (D1A1–D1B8), (DDA1–DDA4), whose noninverting and inverting output terminals generate complementary differential outputs, replace dummy comparator block 30 comparators (CDB1–CDB4), (C1A1–C1BS), (C2A1–C2B8), (C3A1–C3B8), (C1A1–C1B8), (CDA1–CDA4), and by comparator section 82–86 and dummy comparator block 80.

Figure 16:
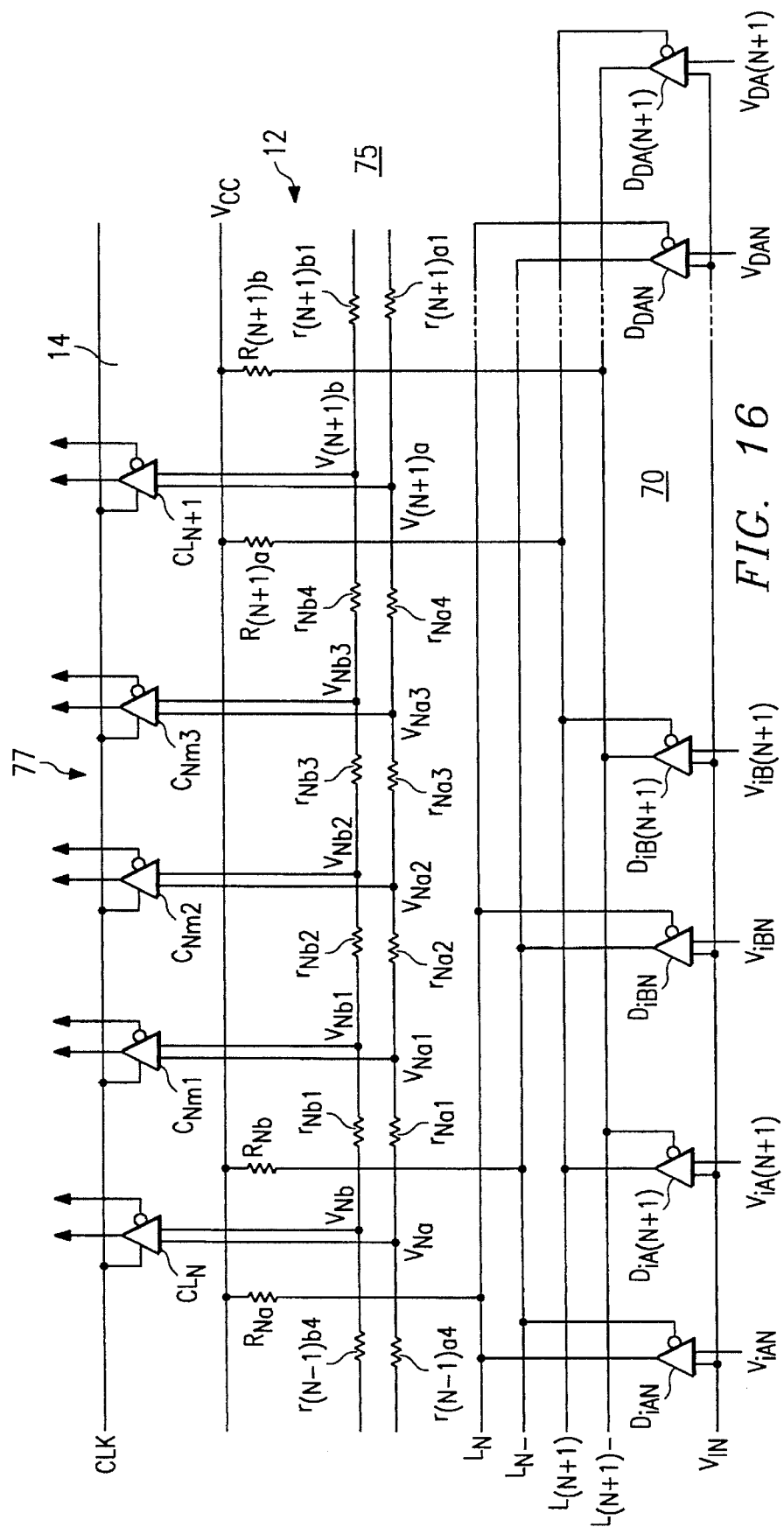
FIG. 16 is a circuit diagram showing the interconnection between stage 1 comparator section 70, adder 12, and second and third comparator sections in FIGS. 14a, 14b and 14c.

As shown in FIG. 16, in stage 1 comparator section 70, the Nth differential amplifier DiAN in group A of the first comparator block is connected at one of its input terminals to tap TiAN of reference voltage generation circuit 36 (not shown), and at its other input terminal to analog signal input terminal 34 (not shown). Its noninverting output and inverting output are connected respectively to one (left) input terminal and the other (right) input terminal of the Nth latched comparator LCN of stage 2 comparator section 14 through lines LN, LN-. Also, the (i)th differential amplifier DiAN in group B of the first comparator block is connected at one of its input terminals to tap TiBN of reference voltage generation circuit 36 (not shown), and at its other input terminal to analog signal input terminal 34 (not shown). Its noninverting output and inverting output are connected respectively to one (left) input terminal and the other (right) input terminal of the (N)th latched comparator LCN of the second comparator section 14 through lines LN, LN-.

Figure 17:
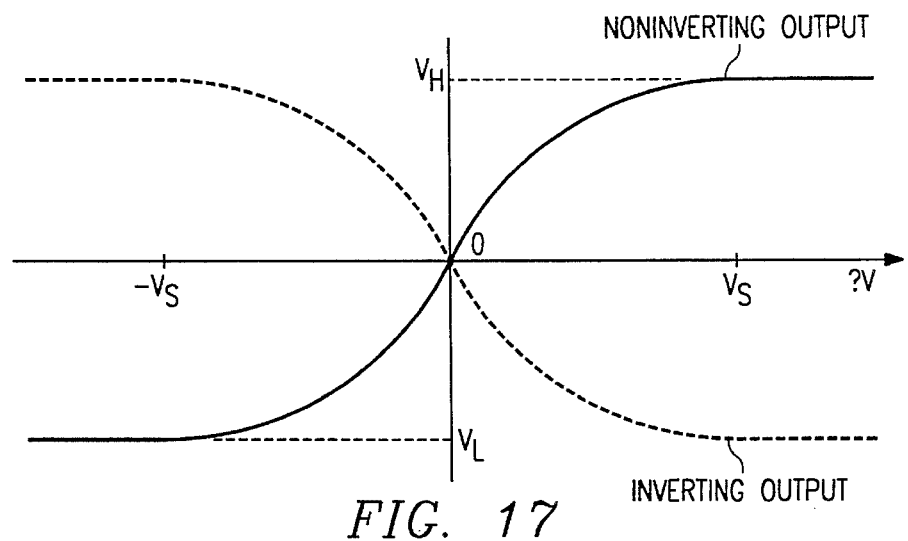
FIG. 17 is a graphical diagram showing the input/output characteristics of each differential amplifier in stage 1 comparator section 70 in FIGS. 14a, 14b and 14c.

FIG. 17 shows the input characteristics of each differential amplifier in stage 1 comparator section 70. When the input voltage on one side (comparison reference voltage) is equal to the input voltage on the other side (input analog signal) and the differential voltage ΔV between them is 0, the noninverting output voltage and the inverting output voltage are equal (for example, 0). When the differential voltage ΔV is in the positive domain, the noninverting output voltage increases as ΔV goes up; when ΔV exceeds a certain value Vs, the noninverting output voltage saturates at an H level, and the inverting output voltage saturates at an L level. When the differential voltage ΔV is in the negative domain, the noninverting and inverting output voltages are reversed, as shown in the diagram.

When such differential amplifiers replace the comparators 10 of the first embodiment, the currents sourced at each differential amplifier through adder 12 resistor pairs (R1a, R1b)–(R8a, R8b) will not be uniform; for differential amplifiers where the input differential voltage ΔV between the input analog signal VIN and the comparison reference voltage is less than Vs, the current sourced (unit current) will be less than for differential amplifiers where the input differential voltage AV between the input analog signal VIN and the comparison reference voltage is greater than Vs; the smaller the input differential voltage AV, the less will be the current sourced. When ΔV is 0, no current is sourced at the differential amplifier.

Figure 18:
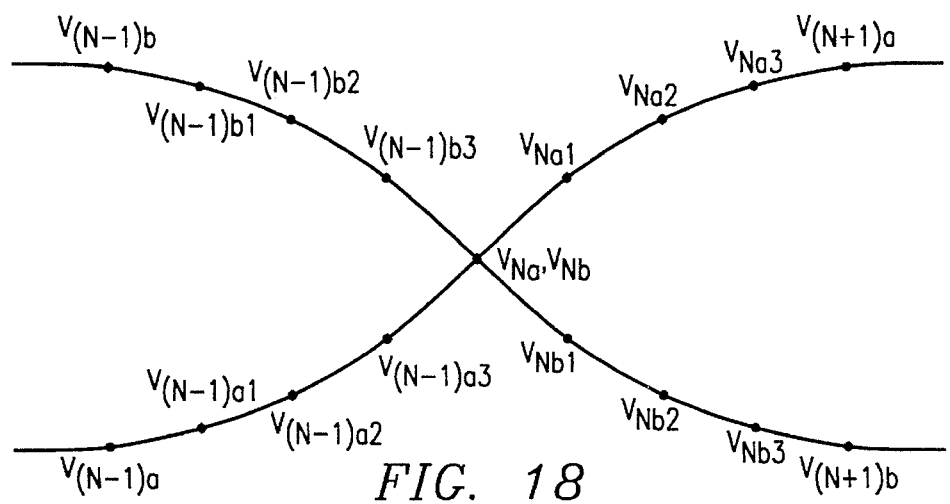
FIG. 18 is a diagram explaining the operation of the lower A/D conversion section of the third embodiment of the A/D converter of FIGS. 14a, 14b and 14c.
Figure 20:
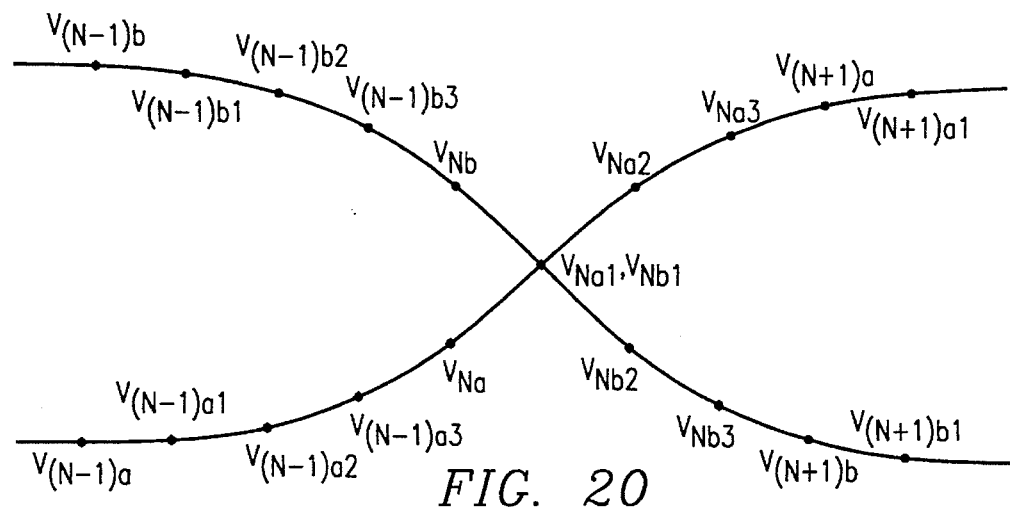
FIG. 20 is a diagram explaining the operation of the lower A/D conversion section of the third embodiment of the A/D converter of FIGS. 14a, 14b and 14c.
Figure 22:
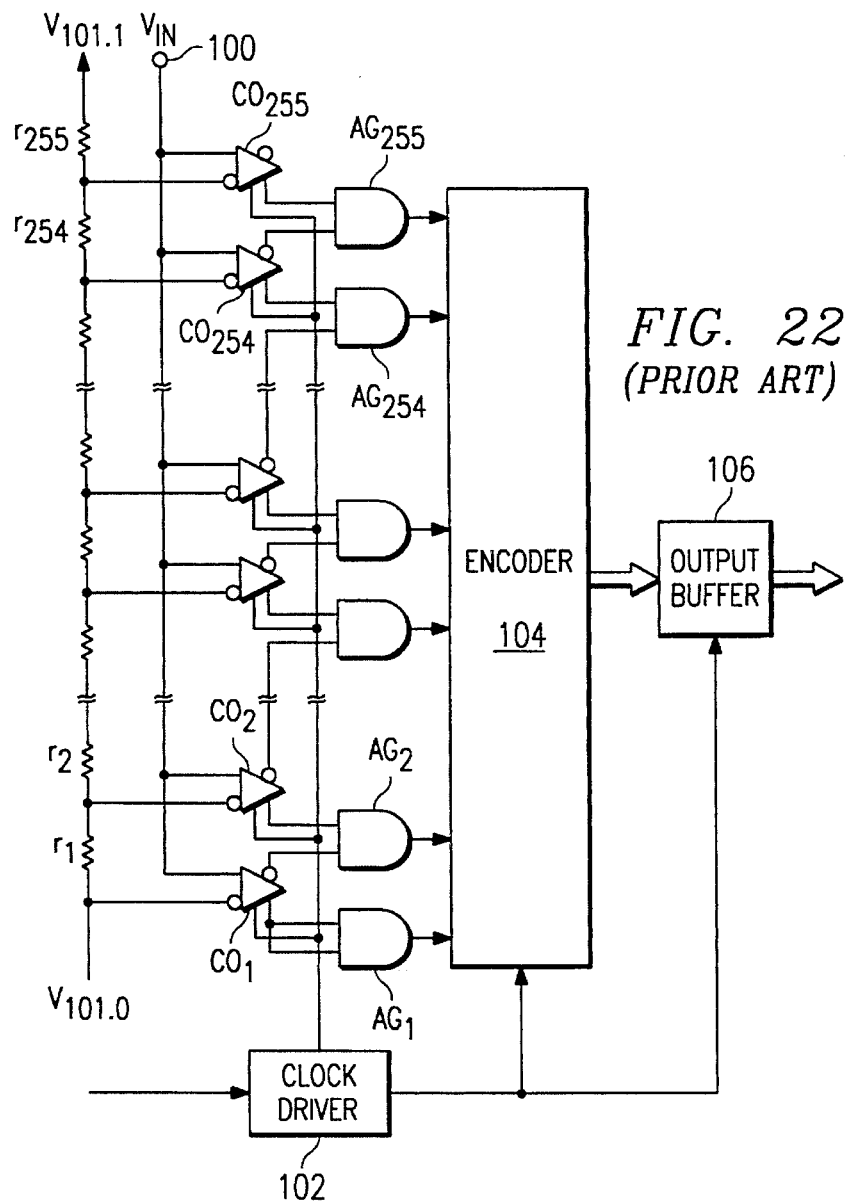
FIG. 22 is a partially schematic circuit diagram of a typical conventional flash A/D converter.
Figure 23:
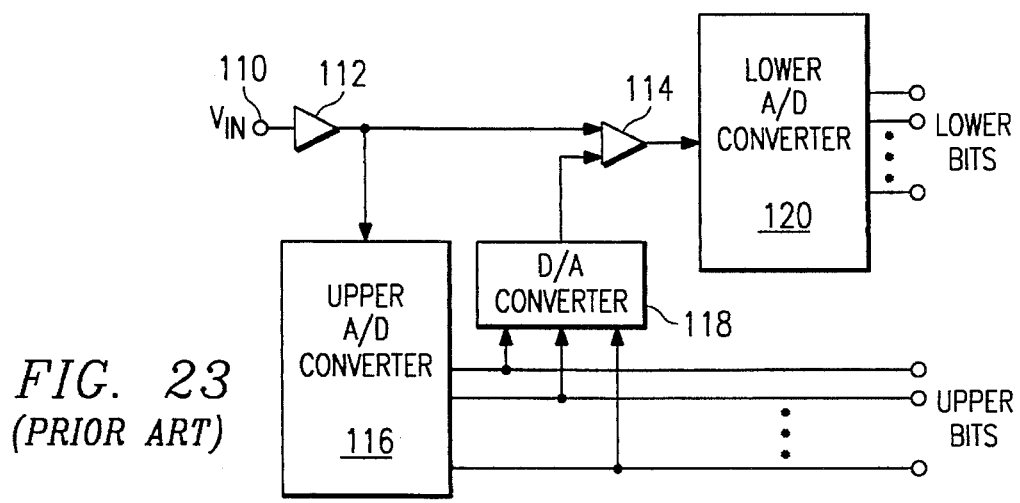
FIG. 23 is a block diagram of a conventional 2-step flash A/D converter.
Figure 24:
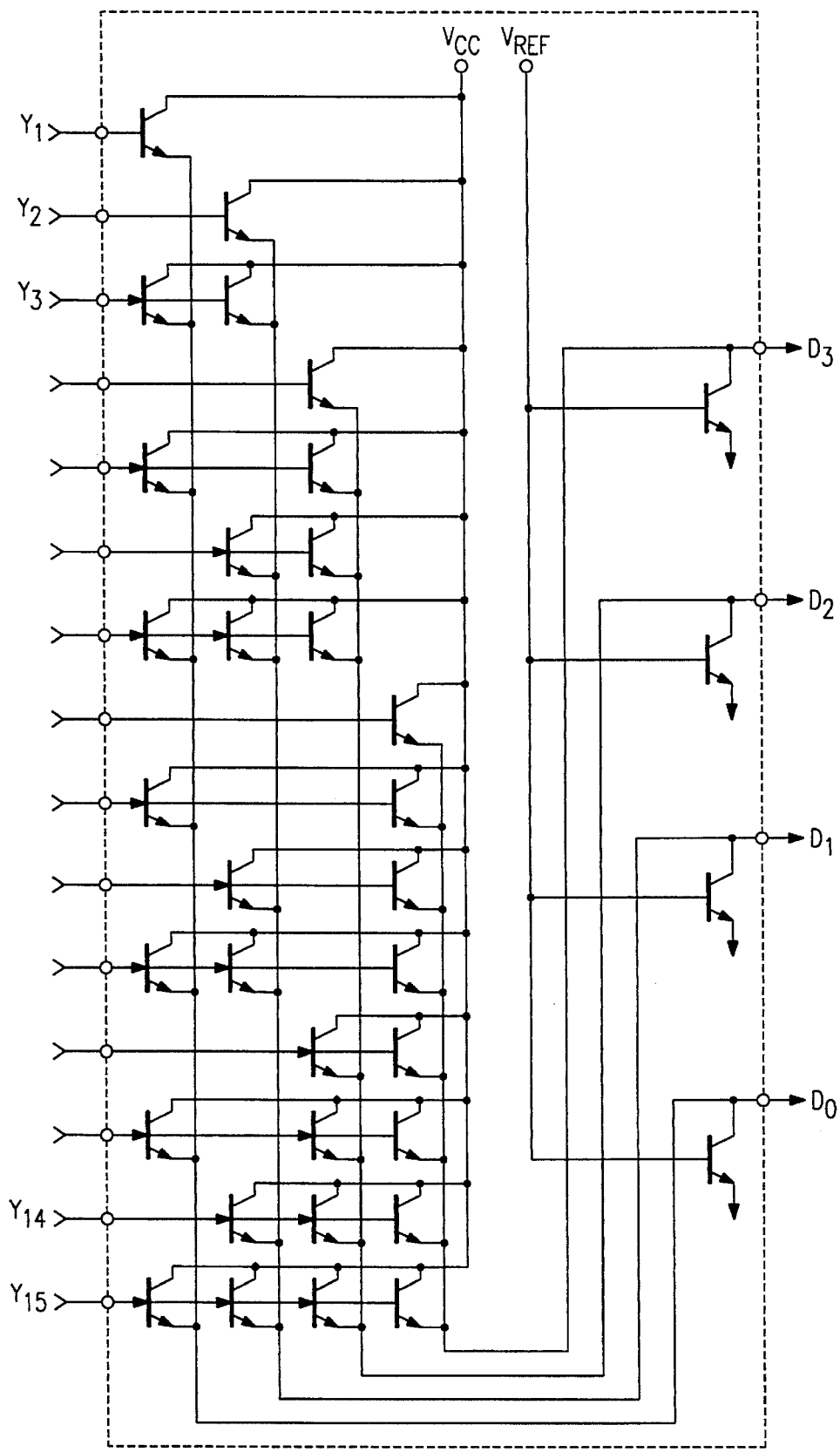
FIG. 24 is a circuit diagram showing an example of a 4-bit encoder.

So, for example, when the voltage level of input analog signal VIN is close to the comparison reference voltage DiAN corresponding to the Nth differential amplifier DiAN within the comparison reference voltage range in any of the group A comparator section blocks of stage 1 comparator section 70, the terminal voltages (V(N−1)a, V(N−1)a, (VNa, VNb), (V(N+1)a, V(N+1)b) of the resistor pairs (R(N−1)a, R(N−1)a, (RNa, RNb), (R(N−1)a, R(N−1)b) on adder 12 are distributed as shown in FIGS. 18 and 20. In these diagrams, v(N−1)a1, v(N−1)a2, v(N−1)a3 are the voltages obtained respectively at the 3 nodes of the first resistor network connected between one side input terminal of the (N−1)th latched comparator LC(N−1) of stage 2 comparator section 14 and one side input terminal of stage 2 comparator section 14 Nth latched comparator LCN. V(N−1)b1, v(N−1)b2, v(N−1)b3 are the voltages obtained respectively at the 3 nodes of the second resistor network connected between the other side input terminal of the (N−1)th latched comparator LC(N−1) of stage 2 comparator section 14 and the other side input terminal of the Nth latched comparator LCN of stage 2 comparator section 14. vNa1, vNa2, vNa3 are the voltages obtained respectively at the 3 nodes of the first resistor network connected between one input terminal of the Nth latched comparator LCN of stage 2 comparator section 14 and one input terminal of the (N+1)th latched comparator LC(N+1), and vNb1, vNb2, vNb3 are the voltages obtained respectively at the 3 nodes of the first resistor network connected between the other input terminal of the Nth latched comparator LCN of stage 2 comparator section 14 and the other input terminal of the (N+1)th latched comparator LC(N+1).

FIG. 18 shows the case where the terminal voltages VNa, VNb of the Nth resistor pairs (RNa, RNb) of adder 12, which is to say the two input terminals of the Nth latched comparator LCN of second comparator section 14, are equal. This occurs when, in stage 1 comparator section 70, the input analog signal VIN voltage level is the same as the comparison reference voltage DiAN in group A of one of the comparator blocks in stage 1 comparator section 70.

FIG. 19 and FIG. 18 show the input and output voltage states of comparator section 14 latched comparators LC(N−1), LCN, LC(N+1) and latched comparators C(N−1)m1, C(N−1)m2, C(N−1)m3, CNm1, CNm2, CNm3 of stage 3 comparator section 77. In all of the latched comparators LC(N−1), C(N−1)m1, C(N−1)m2, C(N−1)m3 in a position below latched comparator LCN, one side (the left) input voltage exceeds the other side (the right) input voltage, so the noninverting output goes to L and the inverting output to H. In latched converter LCN and all the latched converters above it CN, CNm1, CNm2, CNm3, LC(N+1) . . . , one side (the left) input voltage does not exceed the other (the right) input voltage, so the noninverting output is an H, and the inverting output is an L.

In FIG. 20, the input analog signal VIN voltage level is slightly higher than comparison reference voltage DiAN in the A group above, but is lower than the comparison reference voltage DiA(N+1) of the next higher stage. FIG. 21 shows the input voltage and output voltage states for the conditions in FIG. 20 of latched comparators LC(N−1), LCN, LC(N+1) of the stage 2 comparator section 14, and latched comparators C(N−1)m1, C(N−1)m2, C(N−1)m3, CNm1, CNm2, CNm3 of stage 3 comparator section 77. What has changed from the examples in FIGS. 18, 19 is that by a slight increase in the voltage level of input analog signal VIN, the input voltage of one side (left side) of latched comparator LCN exceeds the input voltage of the other side (right side), so the noninverting output and the inverting output are reversed, giving an L and H level, respectively.

The output terminals latched comparators LC1–LC8 of comparator section 14 and latched comparators (C1m1, C1m2, C1m3)–(C8m1, C8m2, C8m3) of stage 3 comparator section 77 are parallel connected to the NOR circuits NA1–NA32, NB1–NB32 in groups A and B of pre-encoder 74, so 32 binary logical outputs are obtained at the A and B group output terminals of pre-encoder 74. Therefore the same coding process used in the first embodiment will yield a 5 bit data from the outputs of lower encoder 76.

Thus the lower A/D conversion section of this example is able to obtain a resolution equivalent to using 32 comparators in the A and B groups of each comparator block.

In resistor network 75, the third resistor network resistors r8a1, r8a2, r8a3, r8a4 are connected in series between one (left) input terminal of the eighth latched comparators LC8 of comparator section 14 and the other (right) input terminal of first latched comparator LC1; the fourth resistor network resistors r8b1, r8b2, r8b3, r8b4 are connected in series between the other (right) input terminal of the eighth latched comparators LC8 of comparator section 14 and the side (left side) input terminals of first latched comparator LC1. Here, in the stage 1 comparator section 70, each group A differential amplifier next to the highest level differential amplifier on the upper side is the lowest differential amplifier in group B, and each group B differential amplifier next to the highest level differential amplifier on the upper side is the lowest differential amplifier in group A, corresponding to the inverted logic between groups A and B with respect to the input analog signal VIN, as shown in FIG. 12.

In this application example, we obtained 3 comparator sampling nodes with first-fourth resistor networks constituted from 4 resistors connected in series, but this is just one example, and it is possible to select the number of resistors and the number of nodes.

In the first embodiment of an A/D converter in accordance with this invention, the resolution of the lower A/D conversion section is raised without increasing the number of encoder input terminals, by increasing the number of comparators.

In the second embodiment of an A/D converter in accordance with this invention, resolution is raised without increasing the number of comparators which compare the input analog signal and the reference voltage.

In the third embodiment of an A/D converter in accordance with this invention, it is possible to obtain the same resolution for the upper A/D conversion section as the lower A/D conversion section by synchronizing their operation; the upper bit error is low, and a highly accurate digital signal can be obtained at high speed.

We claim:

1. An analog/digital converter comprising:
    reference voltage generation means having multiple taps from which different comparison voltages of fixed voltage values are applied in a stepped manner;
    a first comparator section including
        a plurality of comparators having first and second sets of input terminals and non-inverting and inverting outputs, each of said plurality of comparators included in said first comparator section generating a complementary binary output with the first set of input terminals connected in a one-to-one relationship with the taps on said reference voltage generation means and with the second set of input terminals connected to common analog signal inputs, said plurality of comparators included in said first comparator section being arranged in one or a plurality of blocks, with each block being divided into a first set of comparators and a second set of comparators;

a second comparator section including
  a plurality of comparators having first and second sets of input terminals and non-inverting outputs and inverting outputs, each of said first input terminals belonging to the comparators included in said first set of each block of said first comparator section being connected in a one-to-one relationship to the non-inverting outputs of the comparators included in said first comparator section and being simultaneously connected in a one-to-one relationship to the inverting output terminals of the plurality of comparators of said first comparator section belonging to the second set of each block, and each of the second set of input terminals being connected in a one-to-one relationship with the inverting outputs of the comparators belonging to the first set of each block of said first comparator section, and at the same time being connected in a one-to-one relationship to the inverting output terminals of the comparators belonging to the first set of each block of said first comparator section;
an adding section having first and second adding means,
  said first adding means being disposed between said first comparator section and said second comparator section and adding the comparator output of said first comparator section connected together with the first set of input terminals of the comparators of said second comparator section, and
  said second adding means logically adding the outputs of the comparators of said first comparator section connected together with the second set of input terminals of each comparator of said second comparator section; and
encoding means connected to the outputs of the comparators in said second comparator section for combining and encoding the binary logical outputs obtained at each of the outputs of the comparators included in said second comparator section to a digital signal having a selected number of bits.

2. An analog/digital converter comprising:

reference voltage generation means having multiple taps from which different comparison voltages of fixed voltage values are applied in a stepped manner;

a first comparator section including
  a plurality of differential amplifiers having first and second sets of input terminals and non-inverting outputs and inverting outputs, the first set of input terminals of respective differential amplifiers being connected in a one-to-one relationship with the taps on said reference voltage generation means, and the second set of input terminals being connected to common analog signal inputs,
  the non-inverting outputs and inverting outputs of said plurality of differential amplifiers generating a complementary output voltage in response to the difference between the input voltage applied to said first set of input terminals and the other input voltage applied to said second set of input terminals, and
  said plurality of differential amplifiers being arranged in one or a plurality of blocks, with each block of differential amplifiers being divided into first and second sets;

a second comparator section including
  a plurality of first comparators in which each of said first set of input terminals belonging to the first set of each block of said first comparator section is connected in a one-to-one relationship to the non-inverting outputs of the respective differential amplifiers, and being simultaneously connected in a one-to-one relationship to the inverting outputs of the differential amplifiers belonging to the second set of each block of said first comparator section,
  each of said second set of input terminals being connected in a one-to-one relationship with the inverting outputs of the differential amplifiers belonging to the first set of each block of said first comparator section, and being simultaneously connected in a one-to-one relationship to the inverting outputs of the first comparators of said second comparator section;

an adding section including first and second adding means,
  said first adding means being disposed between said first comparator section and said second comparator section for adding the differential amplifier outputs of said first comparator section connected in common with the input terminals of the comparators of said second comparator section, and
  said second adding means logically adding the outputs of the differential amplifiers of said first comparator section connected in common with the second set of input terminals of each comparator of said second comparator section;

resistor network means comprising a plurality of resistor networks including at least first, second, third and fourth resister networks,
  said first resistor network having a predetermined number of two or more resistors connected in series between the first set of input terminals of the first comparators of said second comparator section and respectively connected to the non-inverting outputs of the selectable differential amplifiers into which, in each block of said first comparator section, two comparison reference voltages differing by only one increment are selectively input by said reference voltage generation means,
  said second resistor network having the predetermined number of resistors and connected in series between the first set of input terminals of the two said second comparators to which the inverting input terminals of said two selectable differential amplifiers are respectively connected,
  said third resistor network having said predetermined number of resistors and connected in series between the first set of input terminals of the first comparators of said second comparator section, which are connected to the non-inverting input terminals of said differential amplifiers into which the highest reference voltage from said reference voltage generation means is input in each block of said first comparator section, and the second set of input terminals of the first comparators of said second comparator section which are connected to the inverting input terminals of said differential amplifier, into which the lowest reference voltage is input from said reference voltage generation means in each block of said first comparator section, and
  said fourth resistor network having said predetermined number of resistors and connected in series between the second set of input terminals of said first comparators of said second comparator section, which are connected to the inverting input terminals of said differential .amplifier, into which the highest reference voltage is input from said reference voltage generation means in each block of said first comparator section, and the first set of input terminals of the first comparators of said second comparator section, which are connected to the non-inverting input terminals of said differential amplifiers, into which the lowest reference voltage is input from said reference voltage generation means in each block of said first comparator section;

a third comparator section including a plurality of second comparators having first and second sets of input terminals and non-inverting and inverting outputs, the first set of input terminals of each of said second comparators being connected in a one-to-one relationship with a node of said first resistor network and a node of said third resistor network of said resistor network means, and each of the second set of input terminals of said second comparators being connected in a one-to-one relationship with a node of said second resistor network and a node of said fourth resistor network of said resistor network means; and coding means connected to the outputs of the comparators in said second and third comparator sections for combining and encoding binary logical outputs obtained at each of the outputs of the comparators in said second and third comparator sections to a digital signal of a selected number of bits.

3. An analog/digital converter as set forth in claim 1, further including another comparator section including a plurality of comparators having first and second sets of input terminals, the first set of input terminals of each of said plurality of comparators included in said another comparator section being connected to the taps of said reference voltage generation means for receiving a reference voltage within a reference voltage range with respect to the first and second sets in each block of said first comparator section, and each of the second set of input terminals being connected to the analog signal input terminals;

an upper bit encoding means connected to the outputs of the comparators in said another comparator section for creating a digital signal of a selected number of bits based upon the binary logical outputs obtained at each of the outputs of the comparators included in said another comparator section.

4. An analog/digital converter as set forth in claim 2, further including another comparator section including a plurality of comparators having first and second sets of input terminals, the first set of input terminals of each of said plurality of comparators included in said another comparator section being connected to the taps of said reference voltage generation means for receiving a reference voltage within a reference voltage range with respect to the first and second sets in each block of said first comparator section, and each of the second set of input terminals being connected to the analog signal input terminals;

an upper bit encoding means connected to the outputs of the comparators in said another comparator section for creating a digital signal of a selected number of bits based upon the binary logical outputs obtained at each of the outputs of the comparators included in said another comparator section.

* * * * *